(12) United States Patent
Male et al.

(10) Patent No.: US 10,186,445 B2
(45) Date of Patent: Jan. 22, 2019

(54) WAFER RELEASING

(71) Applicant: Infineon Technologies AG, Neubiberg (DE)

(72) Inventors: Mathias Male, Lienz (AT); Christian Maier, Eberndorf (AT); Philemon Schweizer, Feffernitz (AT); Manfred Bucher, Villach (AT); Thomas Steiner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 232 days.

(21) Appl. No.: 15/209,390

(22) Filed: Jul. 13, 2016

(65) Prior Publication Data

US 2016/0322250 A1   Nov. 3, 2016

Related U.S. Application Data

(63) Continuation of application No. 14/279,137, filed on May 15, 2014, now Pat. No. 9,410,249.

(51) Int. Cl.
| | |
|---|---|
| *H01L 21/683* | (2006.01) |
| *G03F 7/20* | (2006.01) |
| *C23C 16/458* | (2006.01) |
| *H01L 21/687* | (2006.01) |
| *H02N 13/00* | (2006.01) |

(52) U.S. Cl.
CPC ........ *H01L 21/6833* (2013.01); *C23C 16/458* (2013.01); *C23C 16/4585* (2013.01); *G03F 7/707* (2013.01); *H01L 21/6831* (2013.01); *H01L 21/68735* (2013.01); *H01L 21/68742* (2013.01); *H01L 21/68785* (2013.01); *H02N 13/00* (2013.01)

(58) Field of Classification Search
CPC ............. H01L 21/6833; H01L 21/6831; H01L 21/68735; H01L 21/68742; H01L 21/68785; C23C 16/458; C23C 16/4585; G03F 7/707; H02N 13/00
USPC ........................................................ 361/234
See application file for complete search history.

(56) References Cited

U.S. PATENT DOCUMENTS

| | | | |
|---|---|---|---|
| 5,325,261 | A | 6/1994 | Horwitz |
| 5,677,824 | A | 10/1997 | Harashima et al. |
| 6,692,219 | B2 | 2/2004 | Coomer et al. |
| 2003/0178145 | A1 | 9/2003 | Anderson et al. |

(Continued)

FOREIGN PATENT DOCUMENTS

| | | |
|---|---|---|
| CN | 1481577 A | 3/2004 |
| CN | 1851898 A | 10/2006 |

(Continued)

*Primary Examiner* — Kevin J Comber
(74) *Attorney, Agent, or Firm* — Slater Matsil, LLP

(57) ABSTRACT

Embodiments of the present invention provide a chuck system for handling a wafer that comprises a first and a second main surface. The chuck system includes a chuck configured to hold the wafer at the second main surface facing the chuck and a release device. The chuck system further includes an actuator configured to lift the release device away from the chuck. The release device is configured such that the release device mechanically engages with the wafer at an edge portion of the second main surface of the wafer when being lifted, thereby releasing the wafer from the chuck.

19 Claims, 17 Drawing Sheets

(56) References Cited

U.S. PATENT DOCUMENTS

| | | | |
|---|---|---|---|
| 2005/0252454 A1* | 11/2005 | Parkhe | H01L 21/6831 |
| | | | 118/729 |
| 2008/0190367 A1 | 8/2008 | Lee et al. | |
| 2008/0223400 A1 | 9/2008 | Onishi et al. | |
| 2009/0162183 A1 | 6/2009 | Davison | |
| 2009/0209112 A1* | 8/2009 | Koelmel | H01L 21/68742 |
| | | | 438/795 |
| 2013/0168353 A1 | 7/2013 | Okita et al. | |
| 2013/0206070 A1 | 8/2013 | Chen | |
| 2013/0272686 A1 | 10/2013 | Okada et al. | |
| 2014/0017900 A1 | 1/2014 | Doba et al. | |
| 2014/0311676 A1 | 10/2014 | Hatoh et al. | |

FOREIGN PATENT DOCUMENTS

| | | | |
|---|---|---|---|
| JP | 6338559 A | 12/1994 | |
| WO | 2013108750 A1 | 7/2013 | |

\* cited by examiner

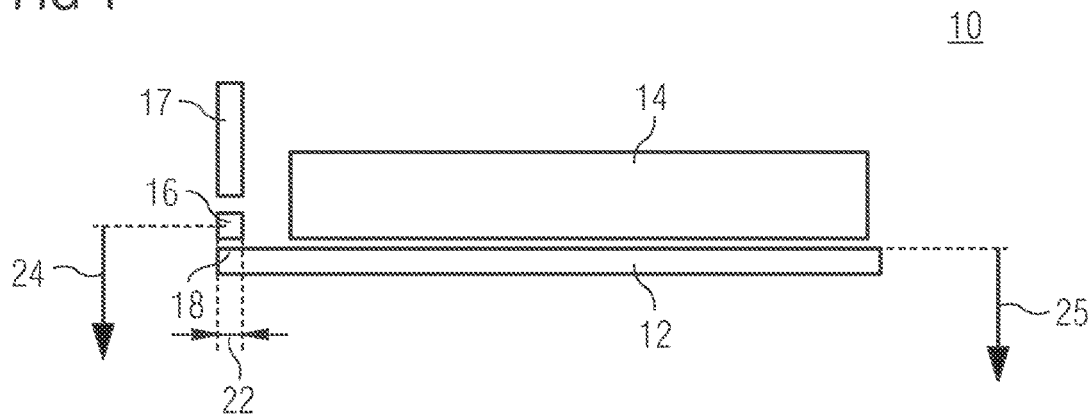
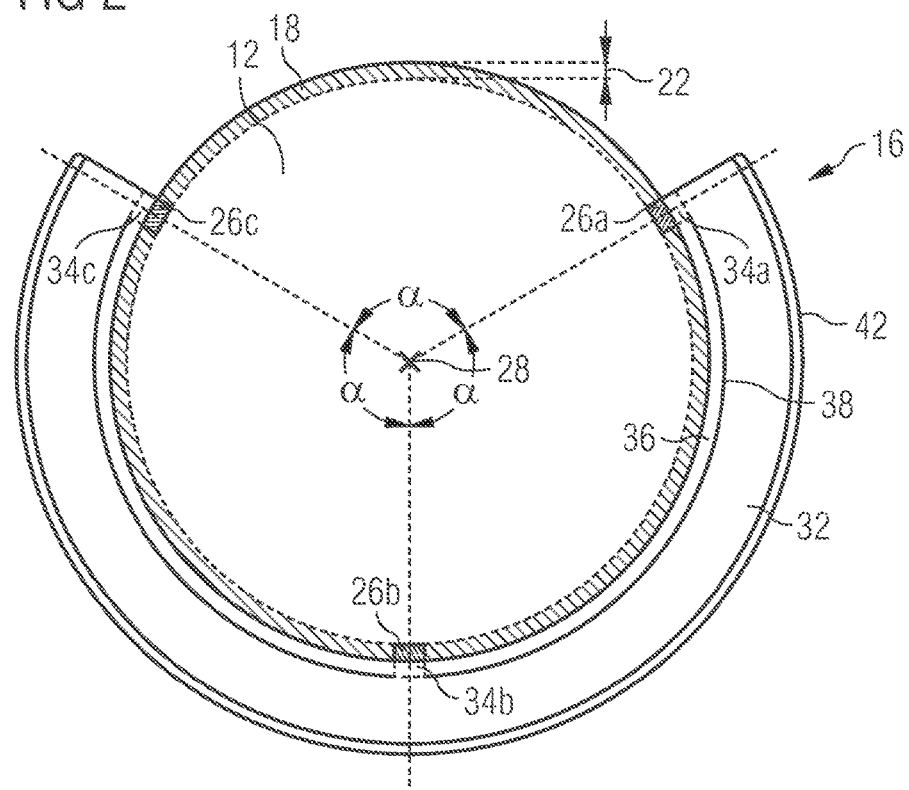

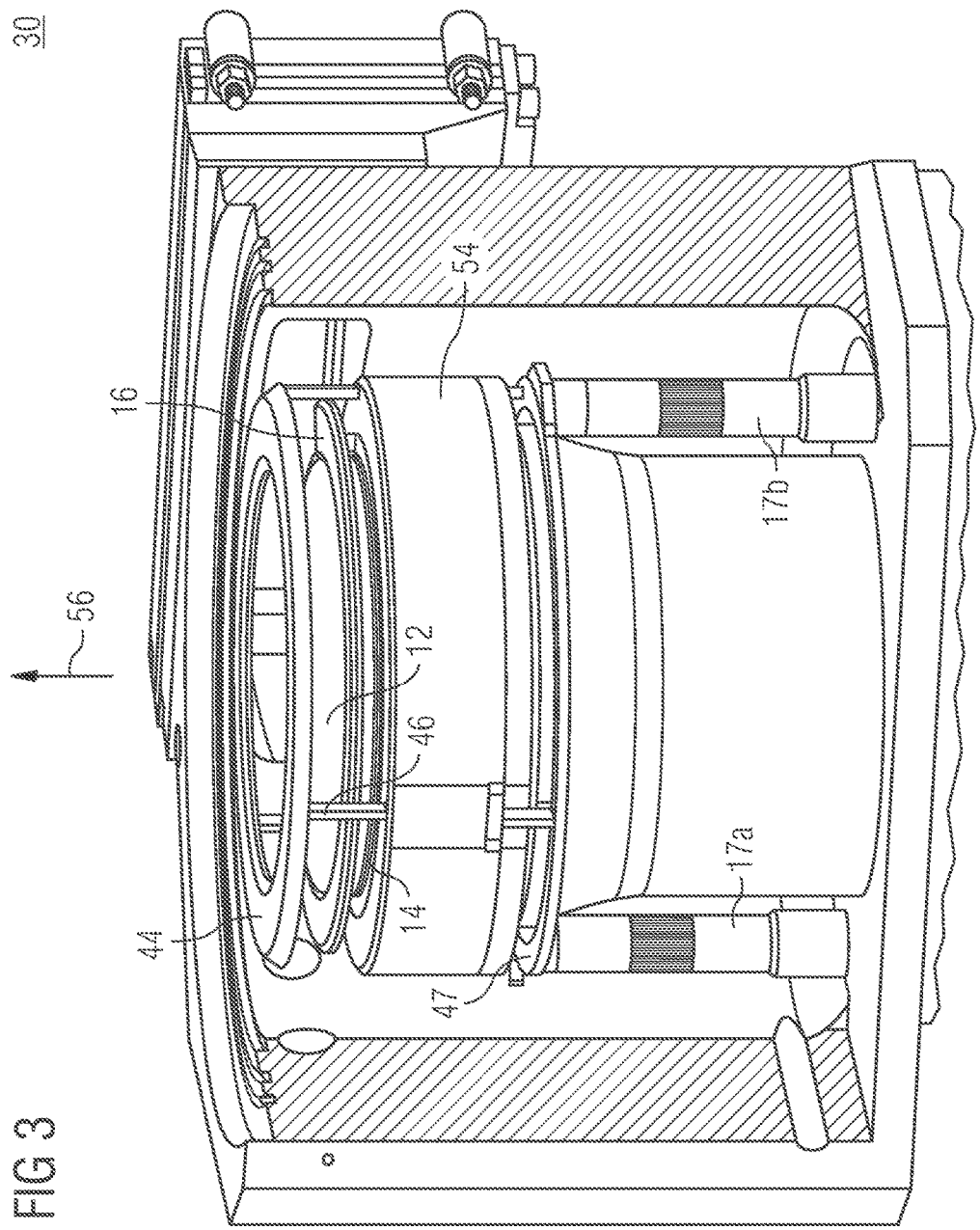

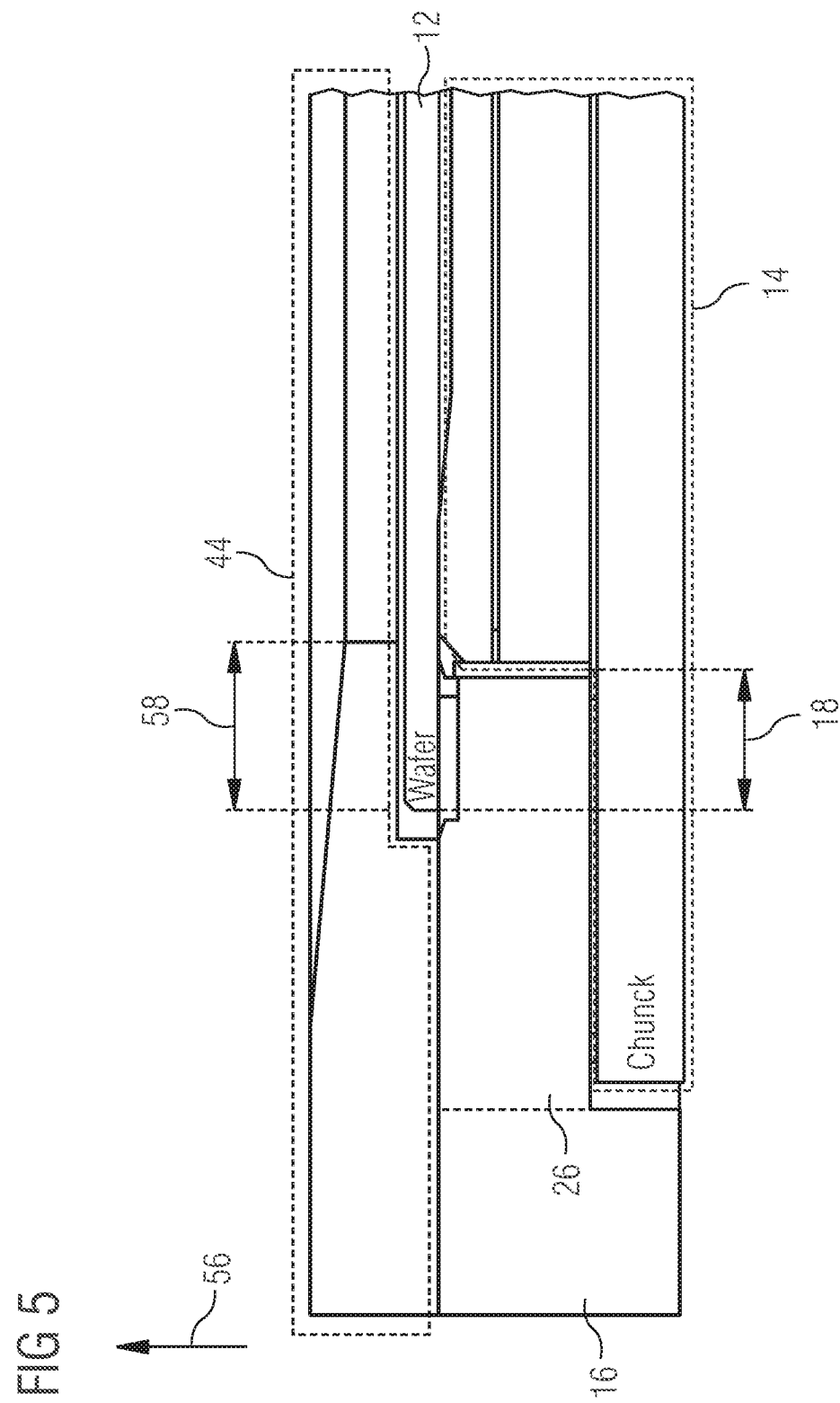

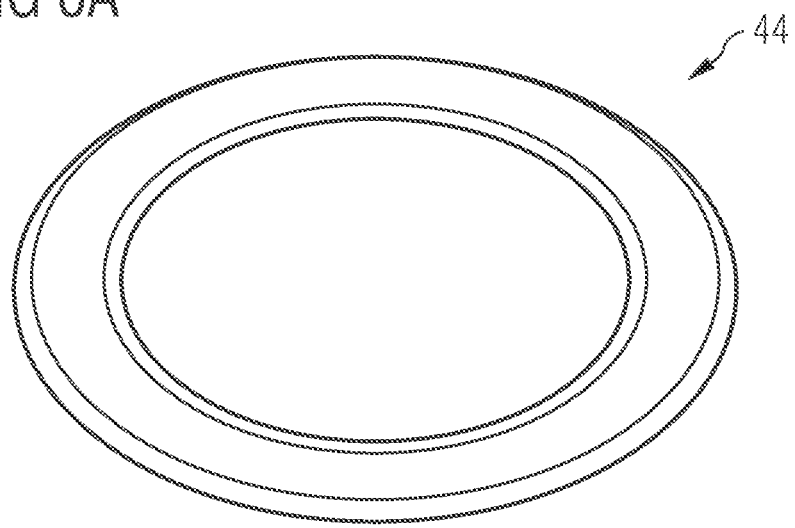
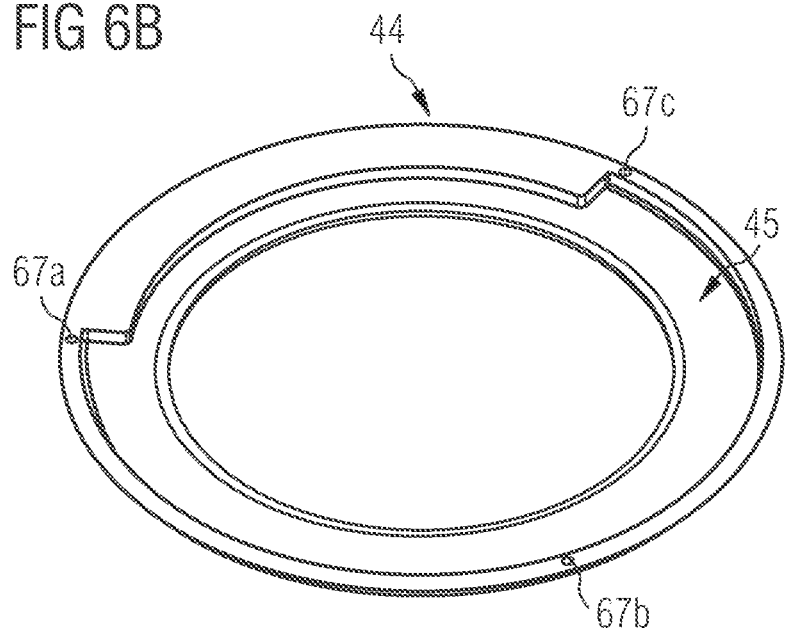

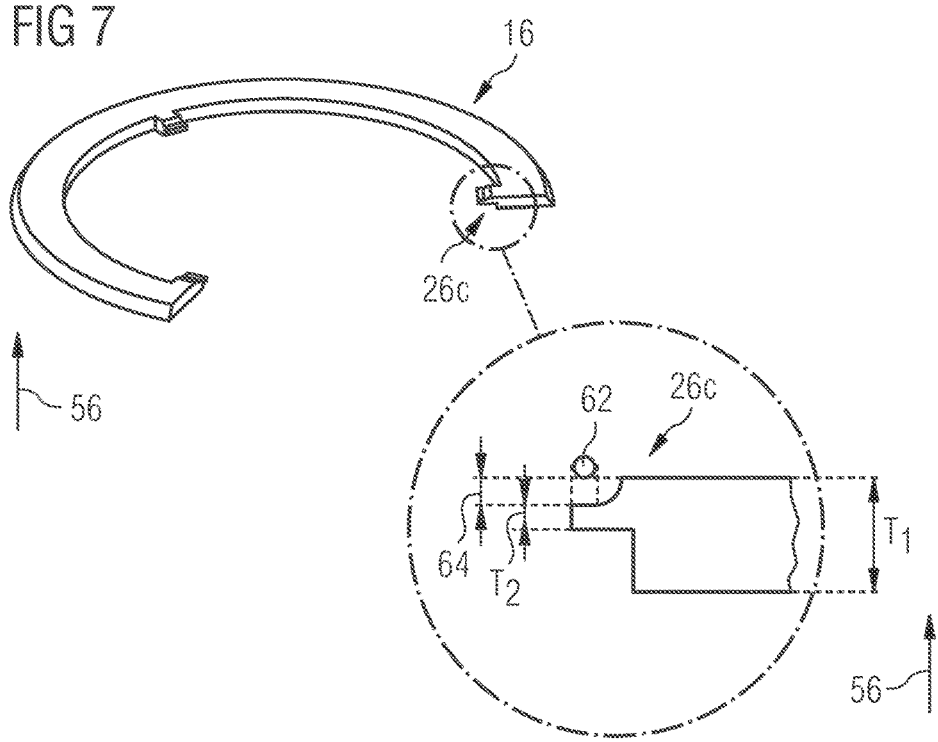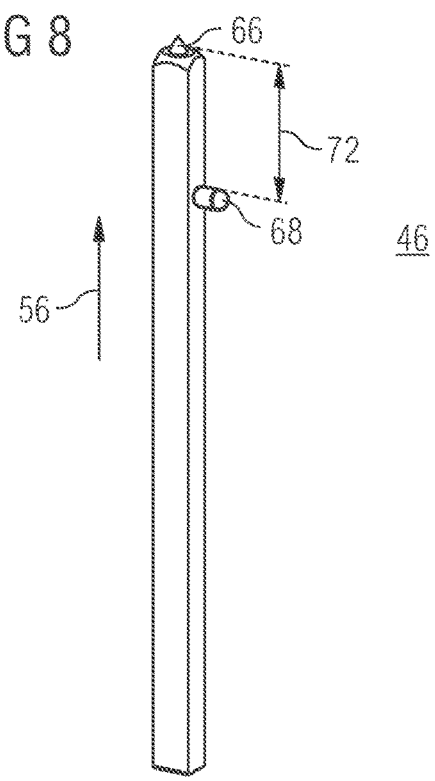

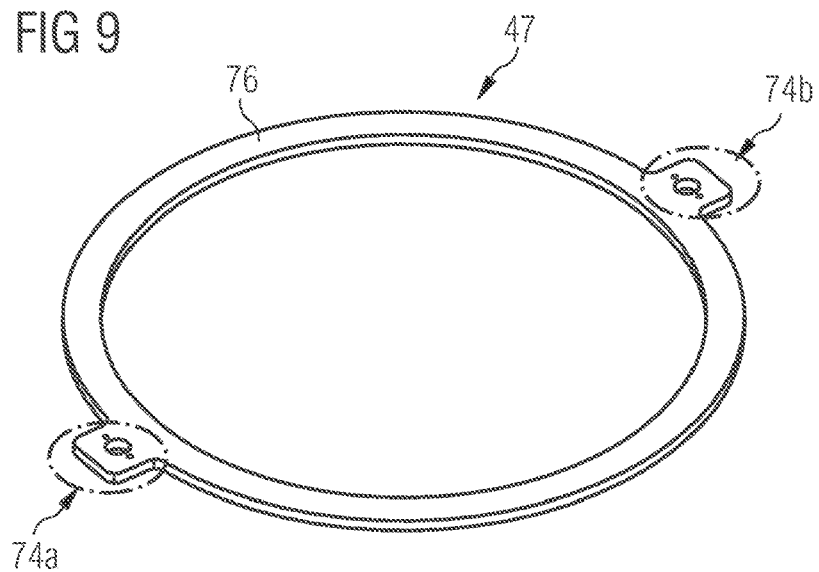
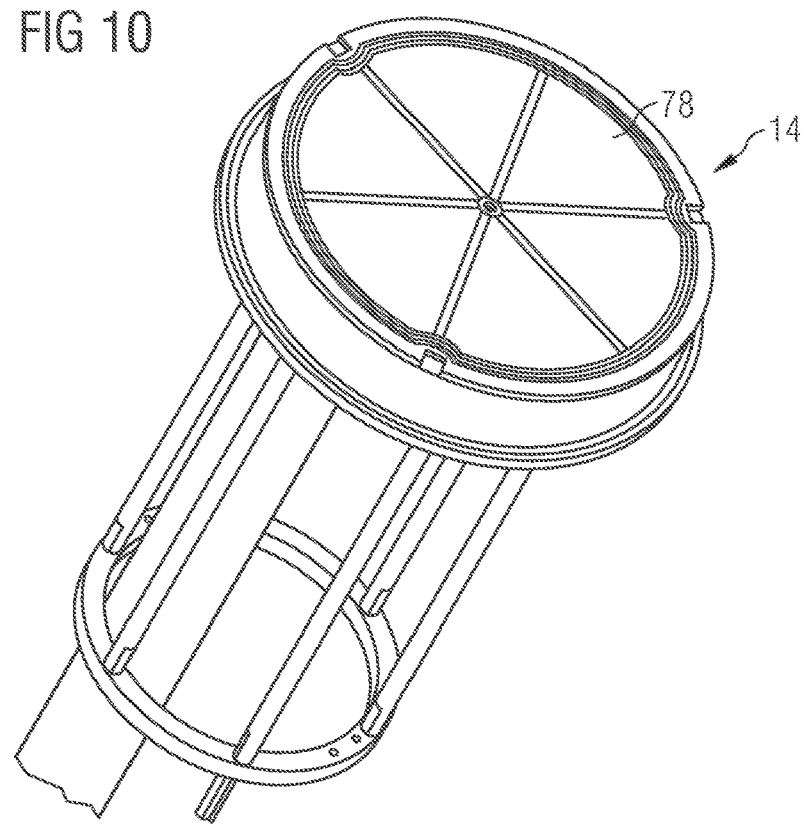

240

WAFER RELEASING

CROSS-REFERENCE TO RELATED APPLICATIONS

This application is a continuation of U.S. patent application Ser. No. 14/279,137, filed on May 15, 2014, which application is hereby incorporated herein by reference.

TECHNICAL FIELD

The invention relates to putting or releasing a wafer to or from a chuck.

BACKGROUND

A wafer may be held by a chuck during processing and may be released from the chuck after processing.

SUMMARY

Embodiments provide a chuck system for handling a wafer. The chuck system comprises a chuck configured to hold the wafer and an integral release device configured to release the wafer from the chuck. The release device is configured to mechanically contact the wafer at an edge portion of the wafer.

Further embodiments provide a wafer processing apparatus which comprises a chuck system for handling a wafer and a processing chamber surrounding the chuck system. The chuck system comprises a chuck configured to hold the wafer and an integral release device configured to release the wafer from the chuck. The release device is configured to mechanically connect to the wafer at an edge portion of the wafer. The processing chamber is configured to adjust an ambient pressure inside the processing chamber, wherein the ambient pressure is smaller than an atmospheric pressure.

Further embodiments provide a method for handling a wafer. The method comprises holding the wafer with a chuck, mechanically contacting the wafer at an edge portion of the wafer with a release device, and releasing the wafer from the chuck with the release device by integrally actuating the release device.

BRIEF DESCRIPTION OF THE DRAWINGS

Embodiments of the present invention are described herein making reference to the appended drawings.

FIG. 1 shows a schematic block diagram of a chuck system for handling a wafer according to an embodiment;

FIG. 2 shows an exemplary top view of the release device being in contact with the wafer according to an embodiment;

FIG. 3 shows a schematic perspective view of a chuck system with the wafer which is inserted, i.e., attached to the chuck system according to an embodiment;

FIG. 5 shows a schematic cross sectional view of a segment of a chuck system with a wafer that is covered by the edge protection device at an edge portion according to an embodiment;

FIG. 6a shows a schematic perspective view of a first side of the edge protection device according to an embodiment;

FIG. 6b shows a schematic perspective view of a second side of the edge protection device according to an embodiment;

FIG. 7 shows a schematic perspective view of the release device with a molding region according to an embodiment;

FIG. 8 shows a schematic perspective view of lift member according to an embodiment;

FIG. 9 shows a schematic perspective view of a lifting ring according to an embodiment;

FIG. 10 shows a schematic perspective view of the chuck, formed as an electrostatic chuck according to an embodiment;

DETAILED DESCRIPTION OF ILLUSTRATIVE EMBODIMENTS

Figure 4C:
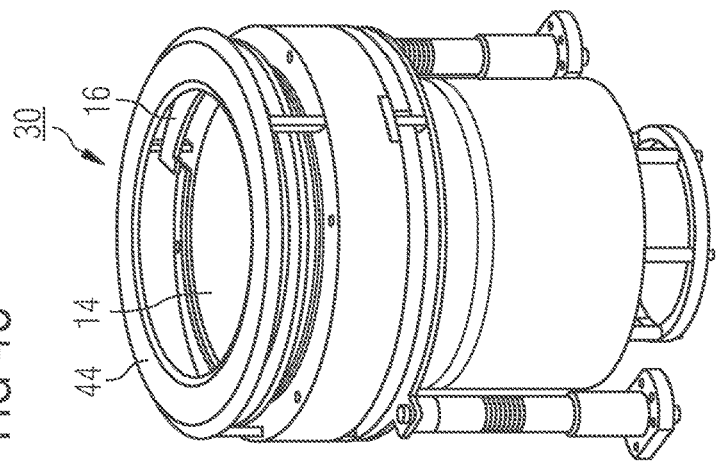
FIG. 4c shows the chuck system depicted in FIG. 4a in an exemplary third state (operating mode). In the third state, the edge protection device and the release device are lifted according to an embodiment.

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the present invention. However, it will be apparent to those skilled in the art that embodiments of the present invention may be practiced without these specific details. In other instances, well known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a schematic block diagram of a chuck system 10 for handling a wafer 12. The chuck system 10 comprises a chuck 14 configured to hold the wafer. The chuck may be, for example, an electrostatic chuck, configured to apply an electrostatic force to the wafer 12 and to hold the wafer 12 by the electrostatic force. The chuck system 10 comprises a release device 16, configured to release the wafer 12 from the chuck 14. The chuck system 10 comprises an actuation unit 17 configured to actuate (i.e., to move) the release device 16. Thus, the release device 16 may be lifted from the chuck. The release device 16 may be formed and/or actuated integrally, i.e., a movement of the release device 16 due to actuation thereof at any point thereof leads to a movement and/or actuation of the complete release device 16. The release device 16 may be formed out of one, two or more parts. When the release device 16 is formed by two or more parts, the parts, may be connected to each other, e.g., by a fitting, a screw hold, a weld seam, an adhesive or the like. One part of the release device 16 being moved actuated or may lead to a movement of the other parts of the release device 16.

The release device 16 is configured to mechanically contact the wafer 12 at an edge portion 18 of the wafer 12 when the actuation unit 17 moves the release device 16. For example, when the wafer comprises a circular shape of a main surface, the edge portion may be formed by an outer ring of the main surface. The edge portion may, for example, comprise a width 22. The width 22 of the outer ring may comprise varying or constant values. The width may be, for example, 1 mm, 3 mm, 5 mm or more from an outer edge or border of the wafer into a direction towards a center of a respective main surface of the wafer. The width may also be a relative value with respect to a dimension of the wafer such as a diameter. The relative value may be, for example, 10% (i.e., 1/10), 5% (i.e., 1/20) or 2% (i.e., 1/50) of the dimension of the wafer. For example, when the wafer is formed as a round plate comprising a diameter of 300 mm, and the relative value is 2%, the edge portion may comprise a width that is 2% of the diameter, i.e., a value of 6 mm.

When the release device 16 is mechanically contacted to the edge portion 18, a movement 24 of the release device 16 in a direction away (lifting direction) from a reference surface of the chuck facing the wafer 12 may lead to a movement 25 of the wafer 12 with respect to the chuck 14. The movement 25 may be directed along the lifting direction when the wafer is released from the chuck. The movement may be directed along an inverse of the lifting direction, when the release device and by this the wafer may be moved towards the reference surface. By moving the wafer towards the reference surface, the wafer may be put to the reference surface, the chuck 14 respectively. The reference surface may be, for example, a surface of the chuck 14 that is configured for being contacted to the wafer 12 when holding the wafer 12. Directions of the movements 24 and 25 may be parallel or comprise an angle with respect to each other. In other words, based on the movement 24 of the release device 16, the wafer 12 is released from the chuck 14.

The wafer 12 may comprise semiconductor material such as silicon and may be a silicon wafer. The wafer 12 may comprise one or more layers, for example, the wafer 12 may comprise a silicon layer and an oxide layer. Alternatively, the wafer 12 may also comprise further layers, e.g., comprising metal or the like and/or circuit architectures.

The wafer 12 may be held by the chuck 14, for example, by electrostatic force. The chuck 14 may be configured to hold the wafer 12 during a processing of the wafer 12. The processing may be, for example, an exposure of a main surface of the wafer 12, opposing a main surface of the wafer 12 facing the chuck 14, to plasma. Alternatively or in addition, the wafer 12 may be processed such that material is deposited on one or more surfaces of the wafer 12.

The processing may comprise one or more processing steps of a processing procedure such that the wafer may be held by a number of chucks subsequently during the processing procedure. The wafer may be transported from one chuck to another or released from a last chuck of a number of chucks subsequently holding the wafer. I.e., after the processing, the wafer 12 may be required to be released from the chuck 14.

During or after a processing step, the wafer 12, being held by an electrostatic chuck, may comprise residual charge of the electrostatic field, although the electrostatic field is switched off (chuck deactivated). Especially when processing is executed in a processing chamber with a pressure level lower than atmospheric pressure or even close to zero (vacuum chambers), attractive forces, e.g., due to the residual charges, between the wafer 12 and the chuck 14 may have to be overcome. This may result in a force, the release device 16 has to apply to the wafer 12 when releasing the wafer from the chuck 14. When, for example, the wafer 12 is arranged above the chuck 14 with respect to an inverse direction of gravity, the force applied to the wafer 12 by the release device 16 may also include a force required to move the wafer 12 against the direction of gravity.

Alternatively to process chambers that are configured to vary the ambient pressure, the chuck system 10 may be, for example, part of a system that may aim for protecting a productive (processed) surface of the wafer 12.

An advantage of the chuck system with the release device configured to mechanically contact the wafer at an edge portion of the wafer is that damages, inflicted or caused by the release device, are limited to the edge portion of the wafer. This allows for preventing an inner region of the wafer (the rest) from being damaged during release, e.g., by tripods or pins. Further, all parts of the release device 16, as far as there is at least a second part of the release device 16, are moved or activated commonly, such that adjusting two or more parts with respect to each other or an adjustment of a control (individual control of parts) of the parts can be avoided. This allows for a higher accuracy, as adjusting two or more parts with respect to each other or an adjustment of the control of the parts may lead to slackness of one or more parts. Slackness may result in inaccuracy of the position of the wafer with respect to a position on a main surface. The inaccuracy may lead to large notches or recesses in or at the chuck, which may lead to parasitic effects during processing. For example, parasitic plasma may travel from through the recess and cause a processing of the wafer at unwanted regions. By avoiding slackness, such effects may also be avoided.

In other words, by usage of the chuck system 10, a usage of the tripod for lifting the wafer 12 may be canceled. A usage of protective lacquer at a front side of the wafer 12 (main surface facing the chuck 14) may also be avoided. Such additional layers might involve increased costs and increased utilization of equipment capacity.

FIG. 2 shows an exemplary top view of the release device 16 being in contact with the wafer 12. The wafer 12 is depicted in an orientation in which the first main surface (back side) of the wafer 12 opposing the front side is oriented in a direction out of the observation plane towards the observer. Thus, a second main surface (front side) that is arranged adjacent or towards (i.e., facing) the chuck during processing, during a time the chuck is holding the wafer 12 respectively, is not shown.

The wafer 12 comprises a round shape of the first and second main surface. The wafer 12 comprises the edge portion 18 that is essentially an outer ring of the wafer 12, which comprise the width 22. The release device 16 is configured to mechanically contact the wafer 12 at three sections 26a, 26b and 26c of the edge portion 18. The sections 26a, 26b and 26c may be arranged symmetrically along an outer circumference of the wafer 12. With respect to a center 28 of the wafer 12 or of the release device 16, the sections 26a, 26b and 26c are spaced by an angle α which may be, for example, 120° in case of three sections 26a-c being present and arranged symmetrically.

In alternative embodiments, the release device is configured to mechanically contact the wafer 12 at a different number of discrete sections of the edge portion, e.g., 1, 2, 4 or more. Although the sections 26a-c are depicted as being arranged symmetrically with respect to the center 28, the sections 26a-c may also be arranged asymmetrically or symmetrically with respect to a different reference point or a different reference line or plane. The sections 26a-c may also be arranged symmetrically with respect to the center 28 within a tolerance range. The tolerance range may be, for example, a range between 0° and 10°, between 0° and 7° or between 0° and 5°. The tolerance range may be, for example, an effect of manufacturing intolerances. Thus, the sections 26a-c are arranged along an outer circumference of the wafer 12.

The release device 16 comprises a frame region 32 and three molding regions 34a, 34b and 34c. The molding regions 34a-c are inwardly extending from the frame region 32, i.e., they are extending in a direction of a center of the release device. The molding regions 34a-c may also be denoted as "fingers". The molding regions 34a-c may be, for example, sections of one part, forming the release device 16. Alternatively, the molding regions 34a-c may be attached partly or as a whole to the frame region 32. Alternatively, one or more molding regions 34a-c may be attached or formed as one piece with parts of the frame region 32, the parts of the frame region 32 being merged together. In other words, although the release device 16 is shown as one part, the release device 16 may also be formed out of two or more parts. Each of the molding regions 34a-c comprises contact regions. In FIG. 2, the contact regions are hidden by the wafer 12. The contact regions are adapted for being contacted mechanically with the wafer 12.

The release device 16 is configured to circumferentially, i.e., at a perimeter, surround the wafer 12 except for a fraction of an outer circumference of the wafer 12. The release device 16 is configured to release the wafer 12 from the chuck by lifting the wafer 12 resulting into a gap between the wafer 12 and the chuck. A wafer transport member, i.e., a fork of a robot, may be configured to insert or to remove (i.e., to transport) the wafer with respect to the chuck system by inserting or removing the wafer 12 into or from the chuck system.

The release device 16 comprises an inner recess 36 forming an inner boundary 38 of the release device 16. The inner recess 36 is configured to host the wafer 12 at least partially with exception of the molding regions 34a-c, the contact regions respectively. When the wafer 12 is formed as a round plate with an outer circumference, the inner boundary 38 of the release device 16 may have a dimension, for example, a diameter, that is equal or larger than a dimension, e.g., a diameter of the wafer. In other words, the inner boundary 38 at least partially encloses an outer edge of the wafer 12 when the outer edge of the wafer 12 and the inner boundary 38 of the release device 16 are projected into a projection plane, for example, the observation plane.

An outer boundary 42 of the release device 16 and the inner boundary 38 are connected to each other. The shape of the release device 16 can also be described, when disregarding the molding regions 34a-c, as a part of a ring structure or as a C-shaped or horseshoe-like structure. An inner diameter of the ring structure is based on a pathway of the inner boundary 38. An opening of the ring structure allows for a more simple insertion and/or removal of the wafer 12 to or off the chuck system.

Although the release device 16 is described as comprising a shape based on a ring structure, the release device may also comprise a different shape, e.g., an elliptical shape, a polygon shape or a combination thereof.

Although, the release device 16 is depicted comprising three molding regions 34a-c and three contact regions 26a-c, in alternative embodiments, a release device may comprise a different number of molding regions and/or a different number of contact regions. The release device may comprise 1, 2 or more than three contact regions. If the release device comprises one contact region, the one contact region may comprise, for example, a continuously formed round shape that corresponds to an outer shape of the wafer to be released.

FIG. 3 shows a schematic perspective view of a chuck system 30 with the wafer 12 which is inserted, i.e., attached to the chuck system 30. The chuck system 30 is shown in a state that may be adjusted before and/or after processing the wafer 12. The wafer 12 is released from the chuck 14. The chuck system 30 comprises the chuck 14 and the release device 16. The chuck system 30 further comprises an edge protection device 44, configured to protect an edge portion of a main surface, e.g., the second main surface and a surface between the first and the second main surface (side surface) of the wafer 12 from being processed during one or more processing steps. The protected edge portion may be a surface at a perimeter of the wafer, such as a circumferential edge portion. The edge protection device 44 may be, for example, a wafer edge protection (WEP)-ring. The protection device may be configured to protect the edge portion of the first main surface against an environment of the chuck such as plasma processing the wafer or deposited material to be arranged at the wafer during processing.

The chuck system 30 comprises lift members 46, so called lift pins and actuation units (bellows) 17a and 17b, for example, two. The actuation units 17a and 17b are configured to actuate the release device 16 with respect to the wafer 12 and with respect to the chuck 14. This may include a lifting ring 47 that is configured for being moved due to an actuation force generated by the actuation units 17a and/or 17b. The lifting ring 47 may be in contact with the lift members 46 such that a movement of the lifting ring 47 may result in a movement of the lift members 46.

The chuck system 30 comprises a lifting ring 47 and a shield ring 54. The actuation units 17a and 17b are configured, when being actuated, to apply a force and therefore to move the lifting ring 47 along a lift direction 56. The lift pins 46 are arranged adjacent to the lifting ring 47, mechanically contacted thereto and may enable a mechanical connection between the actuation units 17a and/or 17b on the one hand and the release device 16 and the edge protection device 44 on the other hand. Thus, when being actuated, the actuation units 17a and/or 17b may provide a movement of the wafer edge protection device 44 away from the wafer 12. The release device 16 may form the mechanical contact to the wafer 12 and increase a distance between the wafer 12 and the chuck 14, such that the wafer 12 is released from the chuck 14 when actuating the actuation units 17a and/or 17b.

The chuck system 30 is adapted to mechanically contact the wafer with the edge protection device 44 at a first edge portion of the first main surface opposing the second main surface of the wafer 12, the second main surface arranged facing the chuck 14. The chuck system 30 is configured to space the edge protection device 44 from the wafer 12, to mechanically contact the release device 16 to the wafer 12 at an edge portion of the second main surface of the wafer 12 and to increase the distance between the wafer 12 and the reference surface of the chuck 14. The distance may be increased such that a transport member, e.g., a fork of a robot, is enabled to receive, deposit and/or transport the wafer 12.

In other words, the edge protection device 44 is arranged such that, when the chuck 14 holds the wafer 12 at a first distance (e.g., a mechanical contact between the edge protection device 44 and the wafer 12) to a reference surface of the chuck 14 (e.g., a surface configured to emit the electrostatic field), the release device 16 is arranged between the edge protection device 44 and the chuck 14. The release device 16 may be partially or completely immersed in the edge protection device 44, i.e., the edge protection device 44 may cover the release device 16, when the edge protection device 44 is located adjacent to the release device 16, e.g., during processing and/or when the wafer 12 is held by the chuck 14. The edge protection device 44 may comprise a housing cavity that may be a counter-form of the release device, the housing cavity configured to incorporate the release device 16. The wafer 12 is arranged between the release device 16 and the edge protection device 44. By releasing the wafer 12 from the chuck 14, the wafer 12 may be lifted up completely from the chuck 14.

In alternative embodiments, a chuck system may comprise a different number of actuation units. The respective chuck system may comprise one actuation unit or three or more actuation units. In FIG. 3, the actuation units 17a and/or 17b are configured to move the lifting ring 47, such that a movement of other components, such as the lift pins 46, the edge protection device 44 and the release device 16 may be inducted uniformly to the respective component. The actuation units 17a and 17b may be configured to actuate, i.e., to generate a movement, along the lift direction 56. The lift direction 56 may be, for example, parallel to a wafer normal, i.e., a normal of the first or second main surface of the wafer. This means, the actuation units 17a and 17b may be configured to actuate the release device 16 linearly along the lift direction 56. In alternative embodiments, one or more actuation units 17a and/or 17b may be configured to generate a movement along one or more directions, wherein the one or more directions may be equal or different from the lift direction 56. A movement along a direction different from the lift direction 56 may be converted partly or completely into a movement of the release device 16 along the lift direction 56. The conversion may be performed, for example, by a leverage or other means for changing a direction of a movement.

Figure 4B:
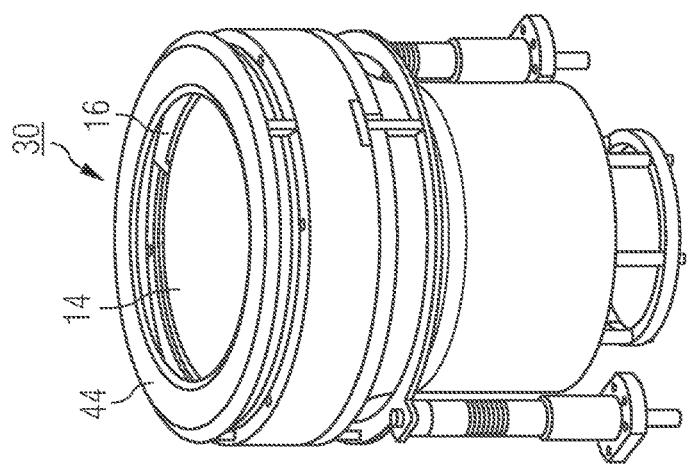
FIG. 4b shows the chuck system of FIG. 4a in an exemplary second state (operating mode). In the second state, the edge protection device is lifted off the wafer according to an embodiment.
Figure 4A:
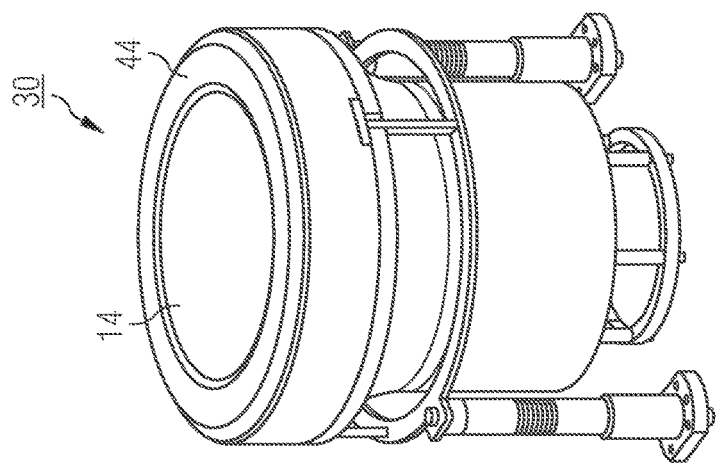
FIG. 4a shows a schematic perspective view of the chuck system of FIG. 3 in an exemplary first state (operating mode) according to an embodiment.

FIG. 4a shows a schematic perspective view of the chuck system 30 in an exemplary first state (operating mode). In the first state, the edge protection device 44 and a wafer (not shown) are arranged adjacent to the chuck 14. In other words, the wafer may be held by the chuck 14 at the second main surface. At an edge portion (region) of the first main surface of the wafer opposing the chuck 14, the wafer may be protected by the edge protection device 44 from being processed. The first state may be an operating mode for processing the wafer, i.e., a target state or a position for the process.

FIG. 4b shows the chuck system 30 of FIG. 4a in an exemplary second state (operating mode). In the second state, the edge protection device 44 is lifted off the wafer (not shown) and the chuck 14. The release device 16 may be "below" the active surface of the chuck 14 configured to generate a force holding the chuck, wherein "below" is referenced to as arranged "before" the wafer along the lift direction 56 and shall not be limited in terms of an orientation of one or more components. Thus, the wafer is not released from the chuck 14, yet. Releasing the edge protection device 44 from the wafer and from the chuck 14 may allow for a cleaning of the wafer edge protection device 44, the wafer and/or the edge portion of the wafer that was covered by the edge protection device 44. The cleaning may be performed, for example, by the plasma used for the process, i.e., for processing the wafer.

The edge protection device 44 may be lifted from the chuck 14 during a cleaning-process, for example, to clean a side (surface) of the edge protection device 44 arranged facing the wafer (e.g., bottom) and/or a contact area or a contact surface of the edge protection device 44 configured to be contacted mechanically to the wafer or to the release device 16.

FIG. 4c shows the chuck system 30 depicted in FIG. 4a in an exemplary third state (operating mode). In the third state, the edge protection device 44 and the release device 16 are lifted. Thus, the wafer, when inserted into the chuck system 30, is released from the chuck 14. In other words, the edge protection device 44 and the wafer are lifted from the chuck 14. The third state may be a position of the components of the chuck system 30 for mounting and demounting the wafer to or from the chuck system 30 and/or to or from a process chamber comprising the chuck system 30. Alternatively, the wafer edge protection device 44 may stay in contact with the wafer 12 and be lifted together with the wafer.

In other words, the states 1, 2 and 3 depict different states of the chuck and components of the chuck system 30 with different degrees of opening of the chuck system 30. Alternatively or in addition, the chuck system 30 may comprise further states, such that a chuck system is not limited to the states depicted in FIGS. 4a-c.

FIG. 5 shows a schematic cross sectional view of a segment of a chuck system, for example, the chuck system 30. The wafer 12 is covered by the edge protection device 44 at an edge portion 58 of the first main surface of the wafer 12. FIG. 5 may be, for example, the first state of the chuck system 30, shown in FIG. 4a. The edge protection device 44 is arranged near to or is forming a mechanical contact to the wafer 12 at the edge portion 58 thereof. The wafer 12 is held by the chuck 14, the release device 16 is arranged adjacent to the chuck 14 and configured to mechanically contact the wafer 12 at the edge portion 18 when the release device 16 is moved along the lift direction 56. The movement of the release device 16 along the lift direction 56 may allow for releasing the wafer 12 from the chuck 14.

FIG. 6a shows a schematic perspective view of a first main surface (first side, e.g., top side or frontside) of the edge protection device 44. The first main surface of the edge protection device may be facing a plasma or another processing media during a (e.g., plasma-) processing of a wafer. The edge protection device 44 may be, for example, a wafer edge protection (WEP)-ring. The edge protection device 44 may comprise, for example, ceramic and/or quartz glass material. The edge protection device 44 may be configured to shield the edge portion and/or a side wall of the wafer during one or more process steps, e.g., against etching plasma or against mechanical contact with other components or parts. This may be required or desired, for example, when the edge portion of the wafer and the side wall of the wafer are not covered with a hard mask or protected by a lacquer.

FIG. 6b shows a schematic perspective view of a second main surface (second side, e.g., bottom side or backside) of the edge protection device 44. The second main surface may be arranged towards (i.e., facing) the chuck in a chuck system such as the chuck system 30. The edge protection device 44 is configured to cover the wafer 12 at an edge portion of the wafer 12. The edge protection device 44 may be configured to partially or completely house a release device of a chuck system, e.g., the release device 16, in a housing cavity 45. The housing cavity 45 may be an inverse shape of the release device. The edge protection device 44 may comprise lifting cavities 67a-c. The lifting cavities may be small, i.e., they may comprise an polygon, elliptical or round shape, e.g., with a diameter of less than 10 mm, less than 7 mm or less than 5 mm. The edge protection device 44 may be configured to be connectable with lifting pins at the lifting cavities 67a-c, i.e., the lifting pins may engage the edge protection device 44 at the lifting cavities 67a-c. By this, the edge protection device 44 may be configured to keep its exact position on the lifting pin using the small lifting cavities 67a,b,c. Alternatively, the release device may comprise a different number of lifting cavities, e.g., none, one, two or more than three.

FIG. 7 shows a schematic perspective view of the release device 16 with the molding region 26c. Making reference to FIG. 2, FIG. 7 also depicts a schematic cross sectional view of the molding region 26c. The molding region 26c comprises a contact region 62 configured for allowing for a contact with the wafer at contact portions thereof. The contact portions may also be regarded as a subset of the contact portions described by the contact regions 62. The contact portions may comprise a surface of, for example, less or equal than 10%, less or equal than 5% or less or equal than 1% of the surface area of the second main surface of the wafer.

A thickness of the release device 16 and/or the molding region 26 may be regarded as an extent of the release device 16 and/or the molding region 26 along the lift direction 56. Alternatively, the thickness may also be regarded as an extent of the respective component along any other direction but for the sake of clarity the term "thickness" shall denote a dimension of a component along the lift direction 56 along which the wafer may be released from the chuck. The molding region 26 may comprise the same thickness as the frame region of the release device 16 at regions where the molding region 26 and the frame region are configured for being attached to each other. Alternatively, the molding region 26 may comprise a different, e.g., smaller, thickness than the frame region of the release device 16.

The molding region 26 comprises a first thickness $T_1$ at a side adjacent to the frame region of the release device 16. The first thickness $T_1$ may be, for example, a value between 1 mm and 100 mm, 2 mm and 50 mm or between 3 mm and 10 mm, e.g., 4.65 mm. The contact regions 62, arranged averted from the frame region, the molding region 26c comprises a second thickness $T_2$, that is smaller than the first thickness $T_1$. The second thickness $T_2$ may be, for example, a value between 0.1 mm and 50 mm, 0.5 mm and 10 mm or between 2 mm and 3 mm, e.g., 2.45 mm.

A smaller thickness $T_2$ at the contact region 62 allows for a reduced temperature stress at the wafer, wherein the contact region 62, the release device 16 respectively, is brought into contact with the wafer. For example, when the release device 16 and the wafer comprise different temperatures, the mechanical contact between the release device 16 and the wafer may induce a temperature stress to the wafer. When compared to the first thickness $T_1$, a reduced thickness $T_2$, therefore a reduced amount of material and therefore a reduced thermal capacity, may lead to a reduction of the thermal stress.

The release device 16 configured to handle an edge portion of the wafer may comprise, for example, ceramic and/or quartz glass materials and may be denoted as one of the largest renewals of the chuck system. The molding region 26 may comprise a deepening 64, configured to limit a possible movement of the wafer 12 along a direction perpendicular to the lift direction 56. I.e., when the wafer 12 is mechanically contacted by the release device 16 within the contact regions 62, a movement of the wafer 12 along a direction perpendicular to the lift direction 56 may be limited by the deepening 64. The deepening 64 may comprise, for example, a value between 0.01 mm and 10 mm, 0.1 mm and 1 mm or between 0.2 mm and 0.5 mm, e.g., 0.3 mm. In other words, the deepening 64 allows for a centering of the wafer 12. The silicon-plate is arranged in the deepening of the release device 16 (i.e., molding region), such that the silicon-plate is prevented from slipping.

FIG. 8 shows a schematic perspective view of the lift member 46. The lift member 46 comprises a first contact region 66 and a second contact region 68. The first contact region 66 and the second contact region 68 are spaced by a distance 72 along the lift direction 56. The distance 72 may be, for example, in a range between 1 mm and 1000 mm, 5 mm and 100 mm or between 10 mm and 30 mm, in particular the distance 72 may be a distance of 20 mm. The first contact region 66 may comprise a shape that is of an inverse shape as lifting cavities, for example, the lifting cavities 67a-c.

When the chuck system comprises the edge protection device, the first contact region 66 may be configured to mechanically contact an edge protection device, for example, the edge protection device 44. The second contact region 68 may be configured to provide another mechanical contact, for example, to the release device. With reference to FIGS. 4a, 4b and 4c, starting from the first state depicted in FIG. 4a, when the lift member 46 is moved along the lift direction 56, the first contact region 66 may mechanically contact to the edge protection device 44, for example, at the cavity 67, such that the edge protection device 44 is lifted. If a wafer is inserted to the chuck system 30, the edge protection device 44 may be lifted off from the wafer wherein the wafer may remain at its position. This may be referred to as a first time instance.

While the lift member 46 is moved further along the lift direction 56, time passes by. After the lift member 46 is moved by the distance 72 along the lift direction 56, the lift member 46 is configured to mechanically contact to the release device 16 at the second contact region 68. This moment may be denoted as a second instant of time. The mechanical contact between the lift member 46 and the release device 16 may lead to a lift of the release device 16, when the lift member 46 is moved further along the lift direction 56. This may lead to the third state, depicted in FIG. 4c. This may also lead to the release of the wafer from the chuck, when the wafer is inserted into the chuck system 30.

A chuck system may comprise one or more, e.g., three, lift members 46. The lift member 46 may also be denoted as lift pin. The second contact region 68 may be formed as bolts and comprise plastic or polymer material such as Torlon or polyetheretherketon (PEEK). The bolts may be attached to a body of the lift member 46. Torlon may allow for low temperature expansion coefficient and therefore for a low change of shape during temperature changes. Alternatively the second contact region 68 may be formed of metal such as aluminum, steel, or the like. The second contact region 68 may be denoted as a catch. During a movement of actuation units, e.g., the actuation units 17a and 17b, the lift members 46 are configured to pick up the release device after a traveling distance, the distance 72, for example, such that the release device releases the wafer from the chuck by its contact regions. Alternatively, the chuck system may comprise another number of lift members, e.g., 1, 2, 4 or more. The lift members may be moved commonly, e.g., when they are interconnected by a lifting ring that is actuated by the actuation units. This may allow for a uniform movement. Alternatively, the second contact region 68 may be formed, for example, as beam, plate or comprise another shape.

In other words, the lift pins, for example, three, may be moved, for example, by a lifting ring. By this, the edge protection device (WEP-ring) is lifted, e.g., immediately, and after a traveling distance of 20 mm also the wafer lifting ring (i.e., the release device) may be lifted. For an entrainment of the wafer lifting ring, the lift pins (lift members 46) may comprise PEEK-bolts that are pressed into the lifting pins. The PEEK-bolts may hook into a respective counter form at the wafer lifting ring, i.e., the release device. Due to the three lifting pins, the wafer lifting ring may always be in a distinct position, i.e., the wafer lifting ring is prevented from twisting or tilting during the lifting. A guidance of the lift pins is performed by three insertions in the shield-ring. The shield-ring is configured to stick the chuck system together and to seal the chuck system.

FIG. 9 shows a schematic perspective view of the lifting ring 47. The lifting ring 47 comprises two contact regions 74a and 74b. The contact regions 74a and 74b allow for a contact with the actuation units 17a and 17b. At a frame region 76 of the lifting ring 47 the lift members may be mechanically contacted, such that when the actuation units move the lifting ring 47, the lift members, e.g., the lift members 46, are moved commonly.

In other words, the lifting ring 47 may interconnect the two actuation units and/or the lift members. During its movement along a moving direction (e.g., the lift direction), induced by the actuation units, the lifting ring 47 is configured to carry the lift members.

FIG. 10 shows a schematic perspective view of the chuck 14, formed as an electrostatic chuck. The chuck 14 comprises a contact region 78. A dielectric layer may be arranged adjacent to the contact region 78. The wafer may be held by the chuck 14 at the dielectric layer, attached or arranged adjacent to the chuck 14, the contact region 78, respectively. Alternatively, the dielectric layer may be a part of the chuck 14, such that the dielectric layer may comprise the contact region 78.

In other words, the chuck 14 may be basically a support for the wafer during the processes. The chuck 14 may be in particular a so called "electrostatic chuck" (ESC).

Alternatively, also a different type of chuck may be arranged within a chuck system, e.g., a chuck with a mechanical clamping system, a vacuum chuck (wafer is clamped by means of a lower pressure than in the surrounding process chamber) or a Gel-Pak chuck.

ESC-chucks are configured to provide an electrostatic field, by which the wafer is fixed. At or on the chuck a dielectric layer is arranged, that may comprise ceramic materials. The dielectric layer may comprise one or more, e.g., two conductive layers. The conductive layers may comprise metallic and/or semiconductor material, such as metal, copper, aluminum or silicon or a combination thereof and may be incorporated into the dielectric layer or arranged adjacent thereto. The two conductive layers may be arranged basically side by side to each other. For example, two adjoining layers or plates may be contacted with a DC or AC high voltage (e.g., ±2000 V, ±5000 V or ±1000 V). This may allow for an electrostatic field that is arranged beneath, for example, shortly above, the chuck.

Figure 11A:
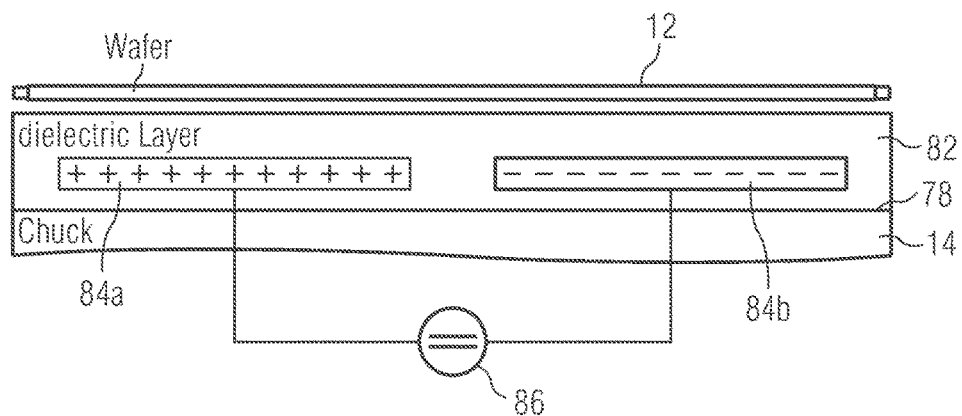
FIG. 11a shows a schematic cross sectional view of a dielectric layer arranged adjacent to a contact region of the chuck according to an embodiment.

FIG. 11a shows a schematic cross sectional view of a dielectric layer 82 arranged adjacent to the contact region 78 of the chuck 14. The dielectric layer 82 comprises a first conductive layer 84a and a second conductive layer 84b. The conductive layers 84a and 84b are each contacted to a power supply 86 that is configured to apply a first voltage to the conductive layer 84a and/or a second voltage to the conductive layer 84b, such that an electric potential may be applied to and/or between the conductive layers 84a and 84b. For example, and with reference to a ground potential, the power supply 86 may be configured to apply a voltage of +5000 V to the conductive layer 84a and a voltage of −5000 V to the conductive layer 84b, such that the electrical potential comprise a value of ±5000 V (10000 V). This allows for receiving of an electrostatic field, configured to hold the wafer 12 at the chuck.

Figure 11B:
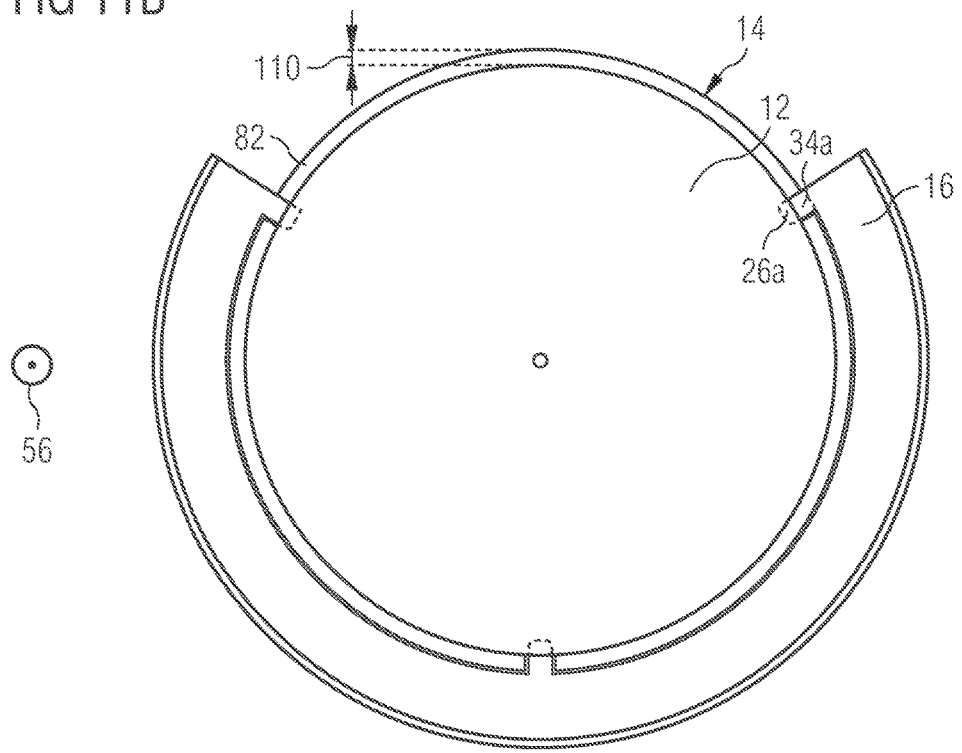
FIG. 11b shows a schematic top view of a dielectric layer arranged adjacent to the wafer according to an embodiment.

FIG. 11b shows a schematic top view of a dielectric layer 82 arranged adjacent to the wafer 12. The dimension, for example, a diameter, of the contact area and/or the dielectric layer 82 along a direction perpendicular to the lift direction 56 may be different to the (corresponding) dimension of the wafer 12 perpendicular to the lift direction 56. For example, the chuck may have a smaller (undersized) or larger (oversized) diameter as the wafer. The difference in dimension may be depicted as an area no, for example. The area no, a corresponding space between the wafer 12 and the chuck 14 with respect to the two diameters respectively, may be configured (used) to incorporate parts of the lifting device 16, for example, the section 26a of the molding region 34a.

Compared to an undersized chuck, an oversized chuck may comprise an increased contact region, for example, an increased contact region 78, that may be arranged beyond the edge of the wafer. This may allow for an improved wafer cooling, an improved RF-coupling and therefore an improved etch uniformity and/or tool performance at the edge of the productive region of the wafer.

For example, a chuck diameter of a chuck according to prior art, the chuck using a TRIPOD to release the wafer, may comprise a diameter of 144 mm. A wafer held by the chuck may comprise, for example, a diameter of 150 mm. An oversized chuck according to an embodiment, as it is depicted in FIG. 11b, for example, may comprise a diameter of the contact region and/or the dielectric layer 82 that is 153 mm. This may lead to a dimension of the area 110 (resulting diameter area) that is 1.5 mm. An oversized chuck may allow for incorporating parts of the release device and improve process performance.

Figure 12:
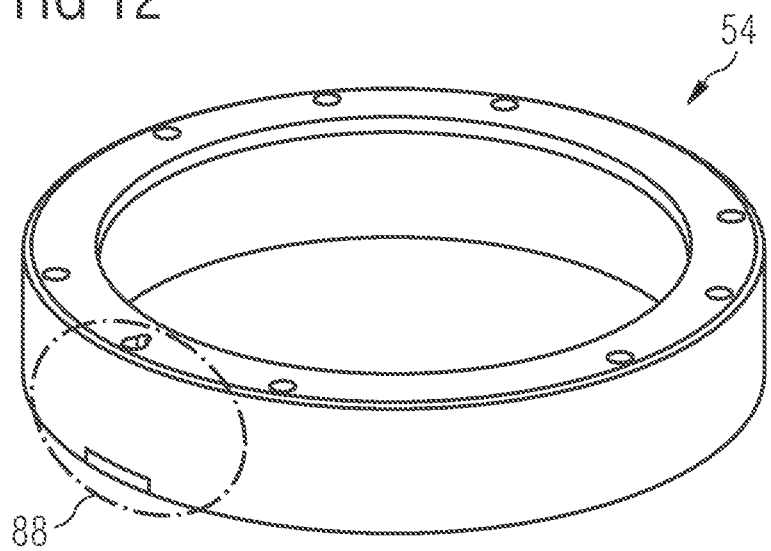
FIG. 12 show a schematic perspective view of the shield ring according to an embodiment.

FIG. 12 shows a schematic perspective view of the shield ring 54. An objective of the shield ring 54 may be to interconnect components of the complete chuck system and to stick the components together. The shield ring 54 may comprise guidance for lift members. The shield ring 54 may comprise the guidance in one or more regions 88. A detailed view of the region 88 is depicted in FIG. 13.

Figure 13:
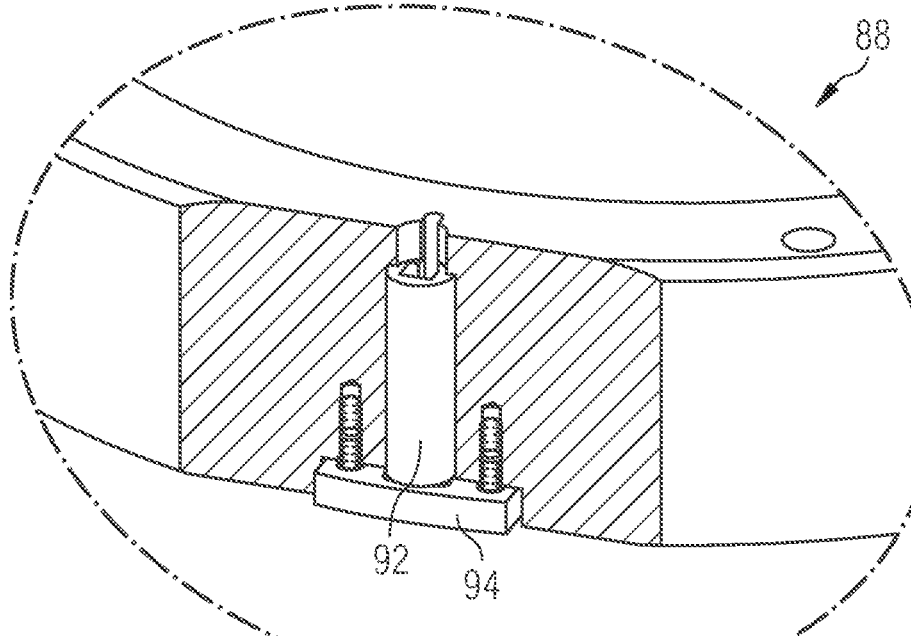
FIG. 13 shows a schematic perspective cross sectional view of the region comprising the guidance for one of the lift members according to an embodiment.

FIG. 13 shows a schematic perspective cross sectional view of the region 88 comprising the guidance for one of the lift members. An insert for enabling the guidance of the lift members may comprise two parts, wherein a first part may be a guidance tube 92. The guidance tube 92 may comprise, for example, Torlon or other polymer or plastic materials, metal, such as steel or aluminum and/or a combination thereof. A second part is a position plate 94. The position plate 94 may allow for adjusting an angular position of the guidance tube 92 and/or the lift members. This may allow for an adjustment of the Torlon-bolts and therefore for an adjustment of positions of contact regions 68 with respect to each other and with respect to counter-forms of the lifting ring.

Figure 14:
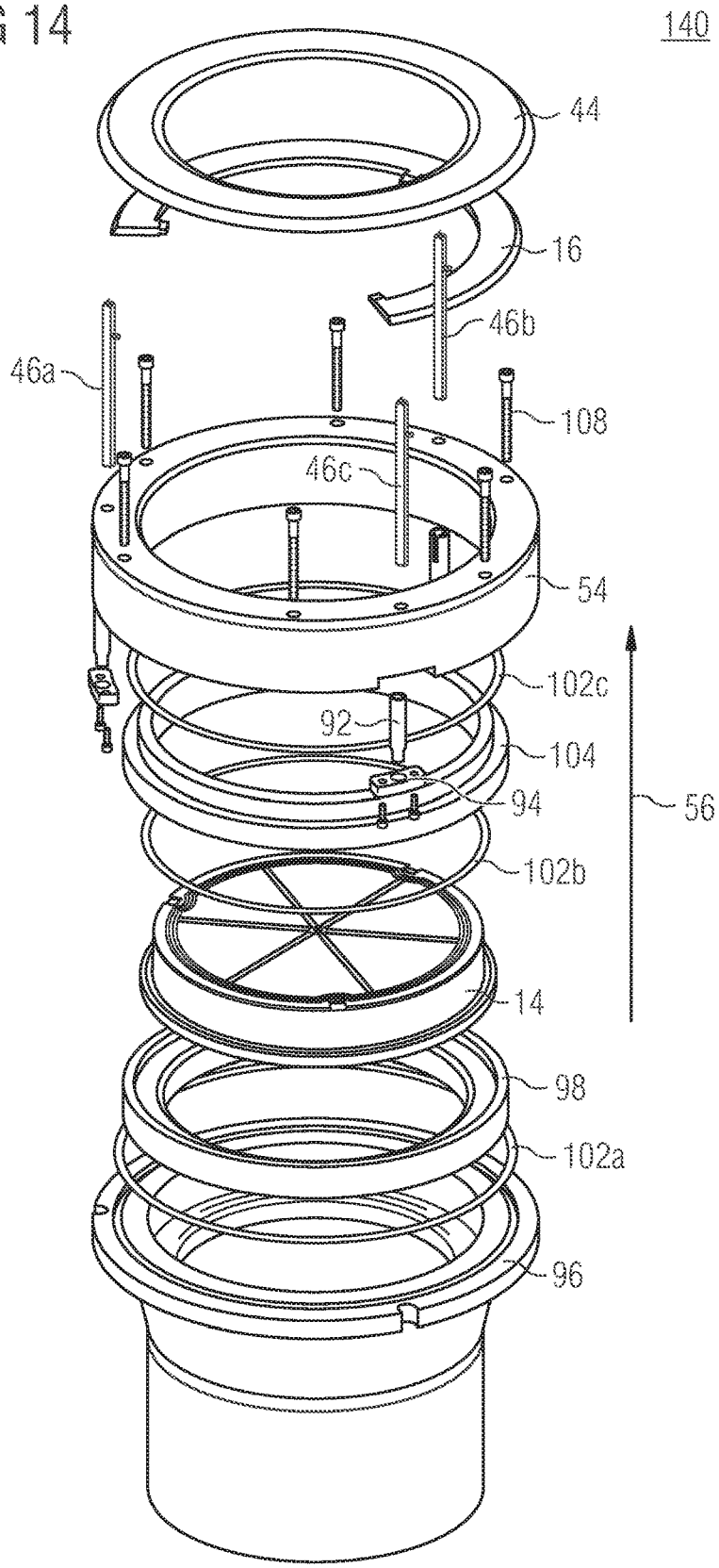
FIG. 14 shows a schematic perspective exploded view of an exemplary chuck system according to an embodiment.

FIG. 14 shows a schematic perspective exploded view of an exemplary chuck system 140.

For the sake of clarity, with reference to FIG. 14 the term "top" is used for a first side/end of the chuck system 140. Further, the term "bottom" is used for a second end of the chuck system 140, wherein the top and the bottom of the chuck system 140 are referenced within FIG. 14 as two opposing ends of the chuck system 140 with respect to the lift direction 56. The term "above" is used to mean "in the direction of the top" and the term "below" is used to mean "in the direction of the bottom". It is clear that the terms top, bottom, above and below are only used for the sake of clarity with respect to an arrangement of components one to another and shall not perform any restrictions with respect to an orientation of any of the reference components. As far as following descriptions of a component comprise values referencing dimensions of the components such as a thickness, a diameter or the like this values shall be regarded as exemplary values. It is clear, that an embodiment may be scaled larger and/or smaller (realized with larger and/or smaller components).

At the bottom, a flange tube 96 is arranged. Above the flange tube 96, a centering ring 98 is arranged. Above flange tube 96 and outside of the centering ring 98 the shield ring 54 is arranged, that may be spaced from the flange tube 96 by an O-ring 102a. The O-ring 102a may, comprise a diameter of 240.89 mm. The O-ring 102a may comprise, for example, a thickness of 3.53 mm.

Above the centering ring 98, the chuck 14 is arranged. Above the chuck 14, a ring structure 104 is arranged. The ring structure 104 may comprise plastic such as Torlon, PEEK, metal, ceramic materials or a combination thereof, i.e., the ring structure 104 may be a ceramic ring. Between the ring structure 104 and the chuck 14, an O-ring 102b with a diameter of 209.14 mm and a thickness of 3.53 mm may be arranged.

Above the ring structure 104, the shield ring 54 is arranged. The shield ring 54 may be configured to, when being mounted, enclose at least partially the ring structure 104 the chuck 14 and/or the centering ring 98. Between the shield ring 54 and the ring structure 104, an O-ring 102c with a diameter of, for example, 228.19 mm and a thickness of 3.53 mm may be arranged. The shield ring 54 may be attached to the flange tube 96 with cylinder screws (cheesehead screws) 108. The lift members 46a-c may be guided by guiding tubes 92, as it is described in FIG. 13. The guiding tubes 92 may be adjusted by position plates 94. Above the shield ring 54, the release device 16 and the edge protection device 44 are arranged, configured to be moved by the lift members 46a-c. Alternatively, the chuck system 140 may be realized without or with a different type of the wafer edge protection device 44, the shield ring 54, the ring structures 104, the centering ring 98, the flange tube 96 including a respective O-ring 102a-d and/or respective interconnections such as bolts and/or screws.

The chuck system 140 may be configured to handle the edge portion of the wafer and may be adapted for an operation at PETI Mori 200 and Aviza-DSi.

Figure 15:
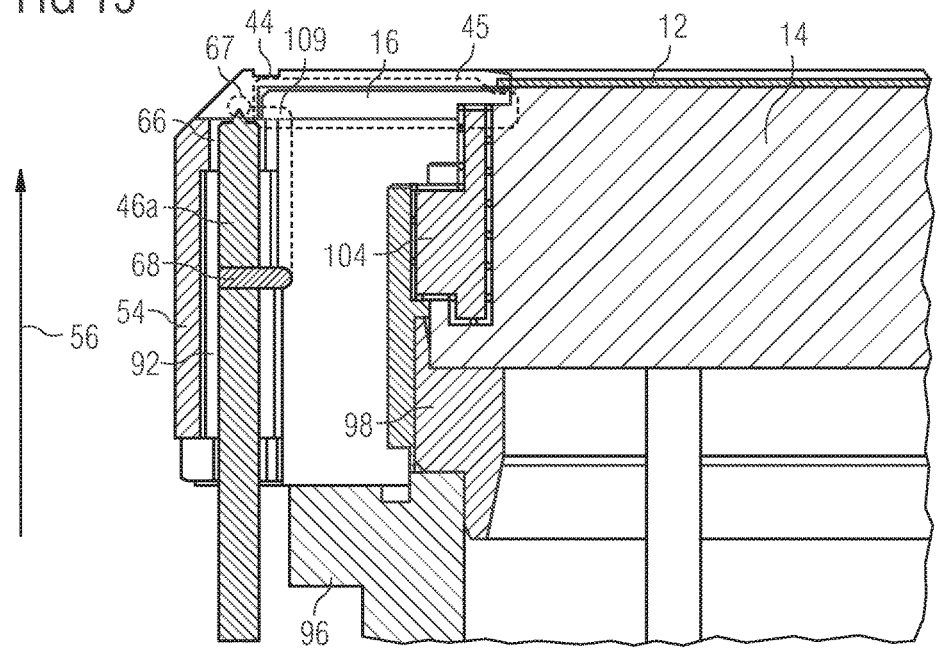
FIG. 15 shows a schematic cross sectional view of the chuck system depicted in FIG. 14 to which a wafer is mounted according to an embodiment.

FIG. 15 shows a schematic cross sectional view of the chuck system 140 to which the wafer 12 is mounted. The release device 16 comprises a counter form 109 into which the contact region 68 (e.g., a Torlon bolt) of the lift member 46a may hook. The chuck 14 comprises the dielectric layer. The release device 16 is arranged inside the cavity 45 formed by the edge protection device 44.

When the lift member 46a is moved along the lift direction 56, first, the first contact region 66 of the lift member 46a engages the lifting cavity 67 of the wafer edge protection device 44 such that the wafer edge protection device 44 is spaced (lifted) from the wafer. Then, the release device may release the wafer 12 from the chuck 14 after the contact region 68 has hooked into the counter form 109.

Figure 16:
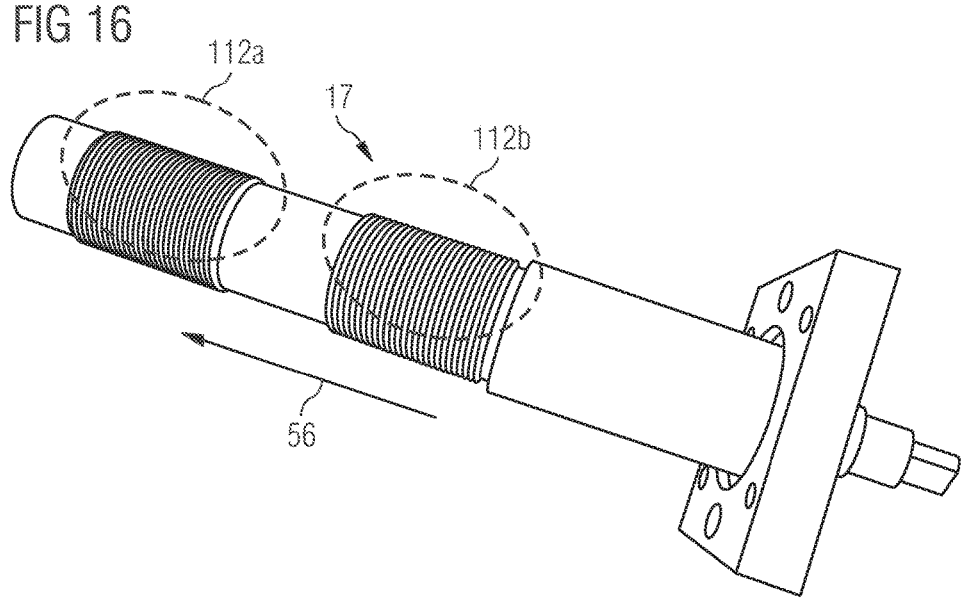
FIG. 16 shows an exemplary picture of a bellow that may be a part of the actuation unit according to an embodiment.

FIG. 16 shows an exemplary picture of an actuation unit 17. The actuation unit 17 may be realized as a bellow structure comprising one or more bellows 112a and/or 112b. A bellow 112a and/or 112b may be configured to allow for a linear movement, e.g., an enlargement or a contraction along the lift direction 56. The actuation unit 17, for example, the bellow, can be regarded as a primary component of a lifting apparatus as it may be an interface between a vacuum environment within a process chamber and between the actuation unit which may be arranged under atmospheric pressure.

Figure 17:
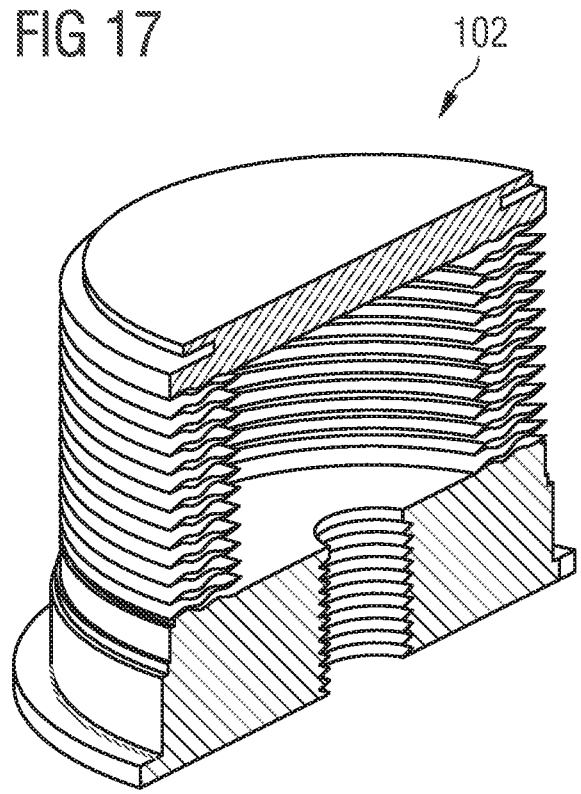
FIG. 17 shows an exemplary cross sectional view of a bellow of an actuation unit according to an embodiment.

FIG. 17 shows an exemplary cross sectional view of a bellow 102. The bellow 102 comprises a plurality of spring segments that are welded together. The welding allows for a configuration of the spring segments that is airtight, such that the bellow 102 may be realized vacuum-tight. By this, the bellow 102 may comprises a spring like additional function. By its structure, the bellow 102 may be configured for a linear movement.

Figure 18:
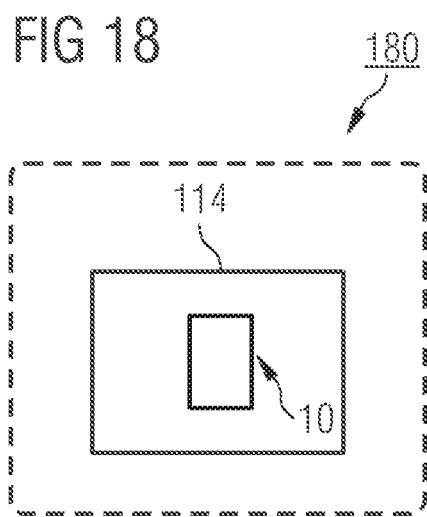
FIG. 18 shows a schematic block diagram of a wafer processing apparatus comprising the chuck system and a processing chamber according to an embodiment.

FIG. 18 shows a schematic block diagram of a wafer processing apparatus 180 comprising the chuck system 10 and a processing chamber 114. The processing chamber 114 is arranged such that the processing chamber 114 surrounds the chuck system 10. The processing chamber 114 may be configured to adjust one or more processing parameters such as an ambient pressure, an ambient temperature and/or an ambient humidity inside the processing chamber. The one or more processing parameters may be smaller or higher than a respective parameter outside the processing chamber 114. For example, the ambient pressure may be smaller than an atmospheric pressure outside the processing chamber. The ambient pressure may be, for example, a half or a quarter of the atmospheric pressure. Alternatively, the ambient pressure may be a vacuum pressure or close to the vacuum pressure. A handling of a wafer inside a processing chamber 114 that comprises a vacuum pressure or a pressure level that is close to vacuum may prevent a wafer being released from a chuck by air pressure. This means that the chuck may be released, for example, mechanically. The chuck system 10 allows for a mechanical release of the wafer from the chuck and prevents the wafer from being damaged in or at a productive surface.

Alternatively or in addition, the processing chamber 114 may comprise at least a second chuck system and/or a different chuck system, such as the chuck system 30.

Figure 19:
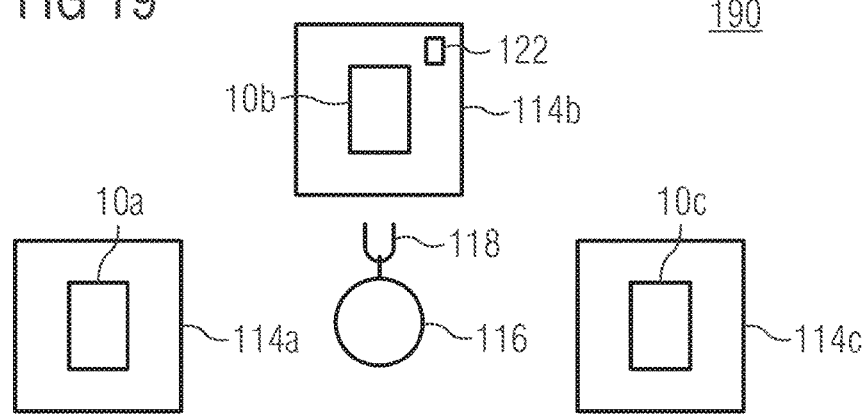
FIG. 19 shows a schematic block diagram of a wafer processing apparatus with three processing chambers according to an embodiment.

FIG. 19 shows a schematic block diagram of a wafer processing apparatus 190. The wafer processing apparatus 190 comprises three processing chambers 114*a*, 114*b* and 114*c*, each comprising a chuck system 10*a-c*. The processing chamber 114*a* comprises (hosts) the chuck system boa, the processing chamber 114*b* comprises the chuck system 10*b* and the processing chamber 114*c* comprises the chuck system 10*c*.

The wafer processing apparatus 190 comprises the transport apparatus 110, for example, a robot. The wafer processing apparatus 190 further comprises a transport member 118. The transport member 118 is configured to receive and to move a wafer from or to one of the chuck systems 10*a-c*. The transport apparatus 110 is configured to move the transport member 118.

Thus, a wafer may be transported from one processing chamber 114*a-c* to another and/or to or from external from or to a processing chamber 114*a-c*. The processing chamber 114*b* comprises a plasma generator 122 configured to generate a plasma. The plasma may be configured to process a wafer held by the chuck of the chuck system 10*b*.

Thus, the chuck system 10 may be configured to release and to lift the wafer, such that the transport member 118 may receive the wafer.

Alternatively, a processing apparatus may comprise a different number of processing chambers, e.g., one, two, four or more.

Figure 20:
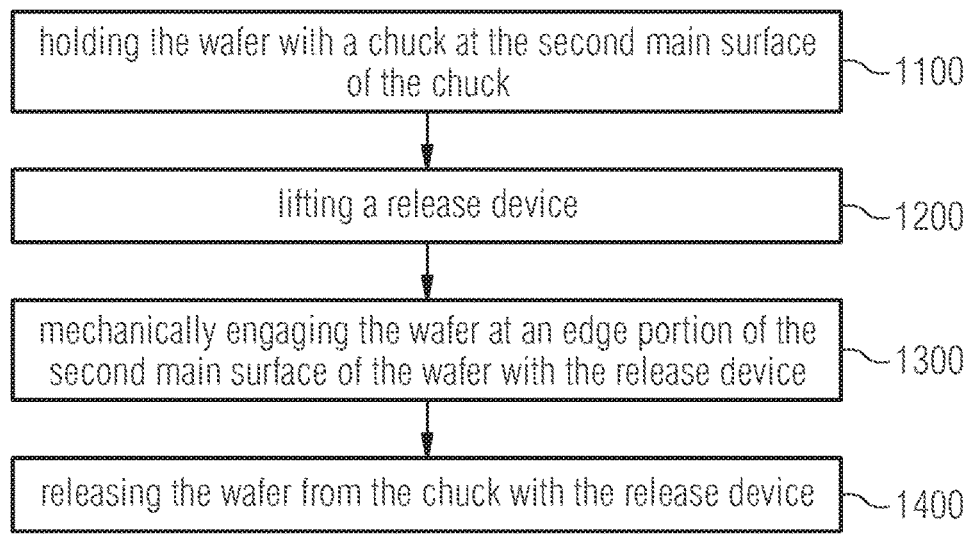
FIG. 20 shows a flowchart of a method for handling a wafer according to an embodiment.

FIG. 20 shows a flowchart of a method 1000 for handling a wafer. In a first step 1100 a wafer is held with a chuck. In a second step 1200 the release device is lifted. In a third step 1300 the wafer is mechanically engaged at an edge portion of the second main surface of the wafer with the release device. In a fourth step 1400 the wafer is released from the chuck with the release device.

Figure 21:
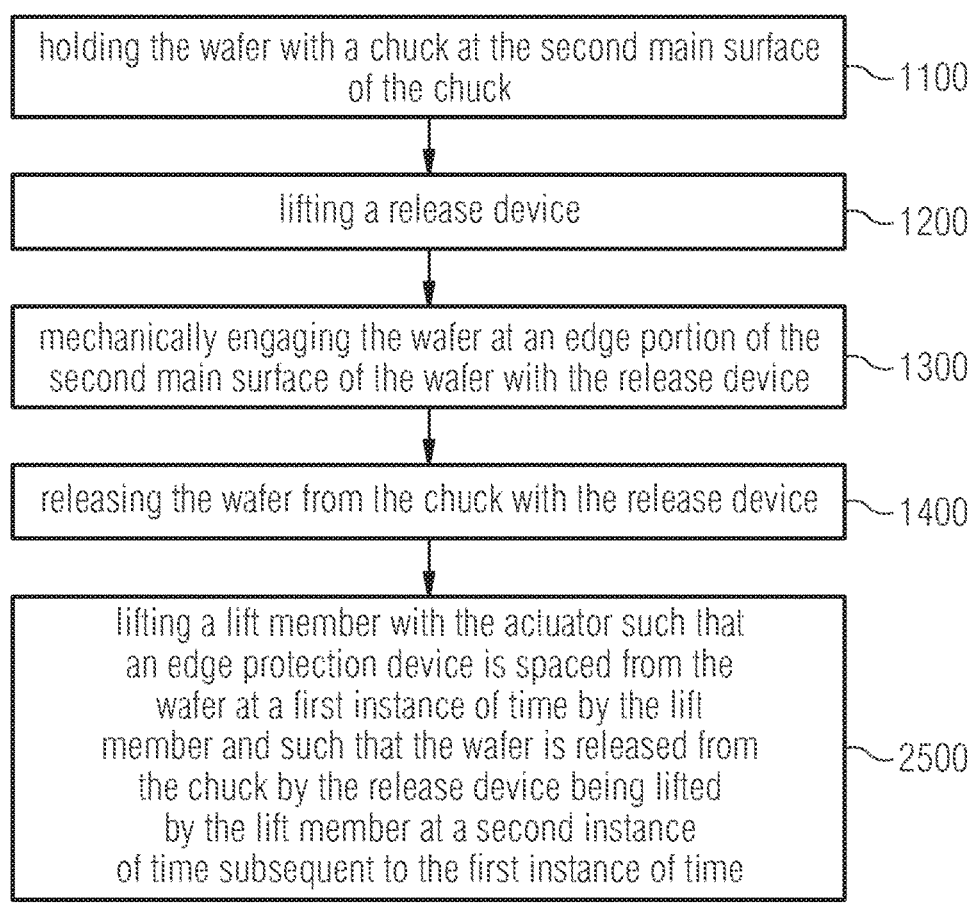
FIG. 21 shows a flowchart of a further method for handling a wafer according to an embodiment.

FIG. 21 shows a flowchart of a method 2000 for handling a wafer. A first step of method 2000 is the step 1100. A second step of method 2000 is the step 1200. A third step of method 2000 is the step 1300. A fourth step of method 2000 is the step 1400. In a fifth step 2500, a lift member is lifted with an actuator such that an edge protection device is spaced from the wafer at a first instance of time by the lift member and such that the wafer is released from the chuck by the release device being actuated by the lift member at a second instance of time subsequent to the first instance of time. The fifth step 2500 may be performed at a time after the step 1100 is performed and before the step 1200, 1300 and/or the step 1400 is performed.

A chuck system according to one of the embodiments of the present invention allows for a reduction of scratches or casts/molds, e.g., damaged membranes, at a productive surface of the wafer. Such defects may occur, e.g., when using a tripod (triple wing lifter) for releasing the wafer. One aspect of embodiments is the release device for handling the edge portion of the wafer. The new chuck system allows the wafer to not be lifted in the middle (as with the tripod) but by the release device, e.g., a lifting ring with three "fingers". The lifting ring may be characterized in that no additional adjustments with respect to a height of single contact surfaces may be necessary, as the single contact surfaces forms a unit.

The plate (wafer) may be lifted at the unused edge portion of the wafer. The unused edge portion of the wafer may be a portion that is free from structures and/or components. The edge portion may be, for example, 3 mm broad. The lifting may be performed at three small surfaces (regions) that may show an angle of 120° to each other.

A new chuck system according to an embodiment may be adapted such that the lifting system of the chuck may contact the non-productive edge portion of the wafer, which may be, for example, 3 mm broad at its maximum. Alternatively, the edge portion may comprise another predefined value. This allows for a prevention of unnecessary scratches or strains on or at the wafer edge and/or surfaces, for example, at productive (used) portions where structures may be present or planned to be processed.

A chuck system according to an embodiment may be interesting (i.e., utilized) in case, a structured surface that may be sensitive or critical with respect to mechanical loads is being contacted, e.g., by the transport system and/or the chuck. For example, such a process may be a deposition of a protective oxide at a wafer back side. A release device may be used in or at arrangements or processes where an outer dimension such as a radius or a diameter of the chuck is comparable with a respective dimension of the wafer. A respective application may be realized for vacuum chambers but is not restricted thereto.

Figure 22:
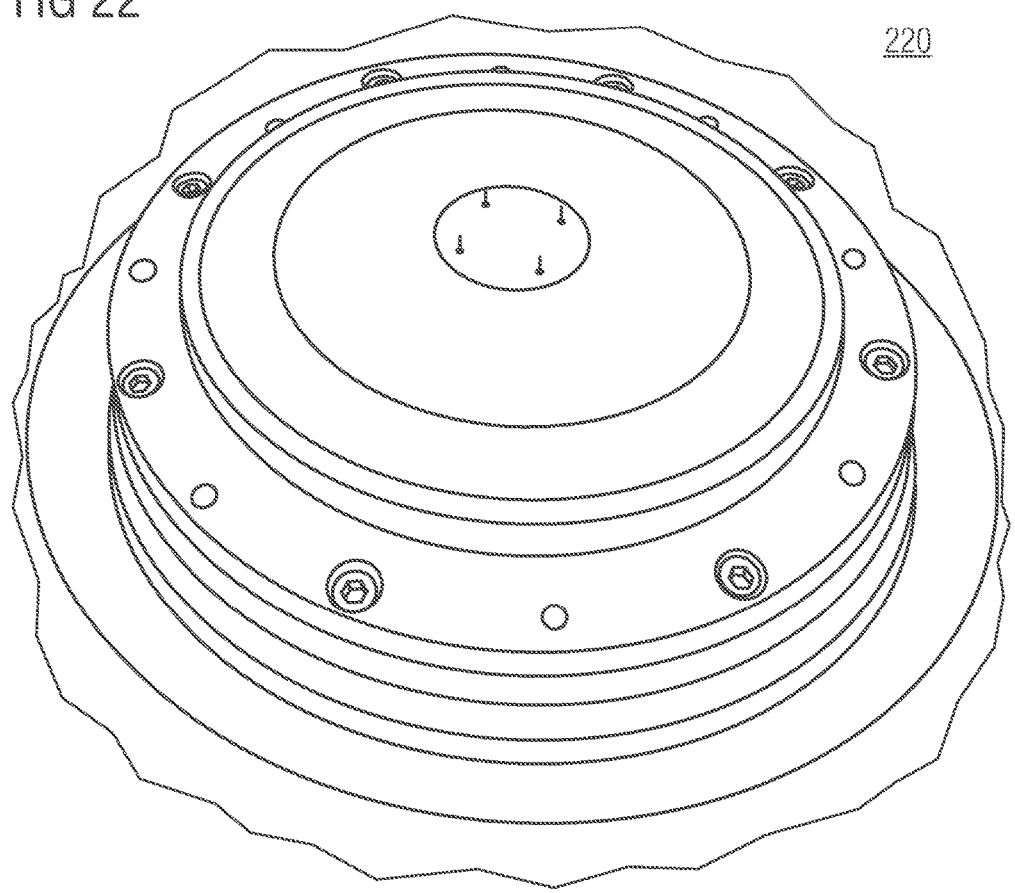
FIG. 22 shows an exemplary picture of a lifting system according to prior art.

FIG. 22 shows an exemplary picture of a lifting system 220 according to prior art. The lifting system 220 utilizes four pins for a release of a wafer that touch a productive surface of the wafer.

Figure 23:
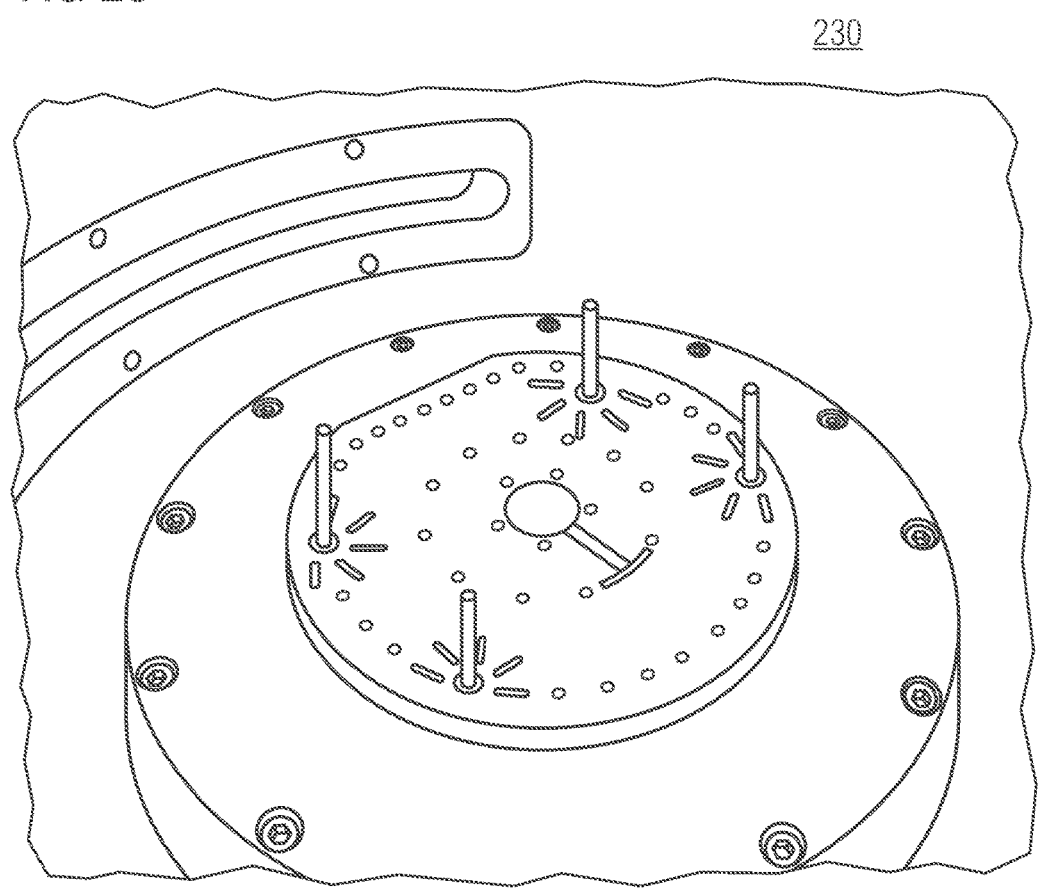
FIG. 23 shows an exemplary picture of a further lifting system according to prior art.

FIG. 23 shows an exemplary picture of a further lifting system 230 according to prior art. The lifting system 230 utilizes four pins for a release of a wafer that touch a productive surface of the wafer.

Figure 24:
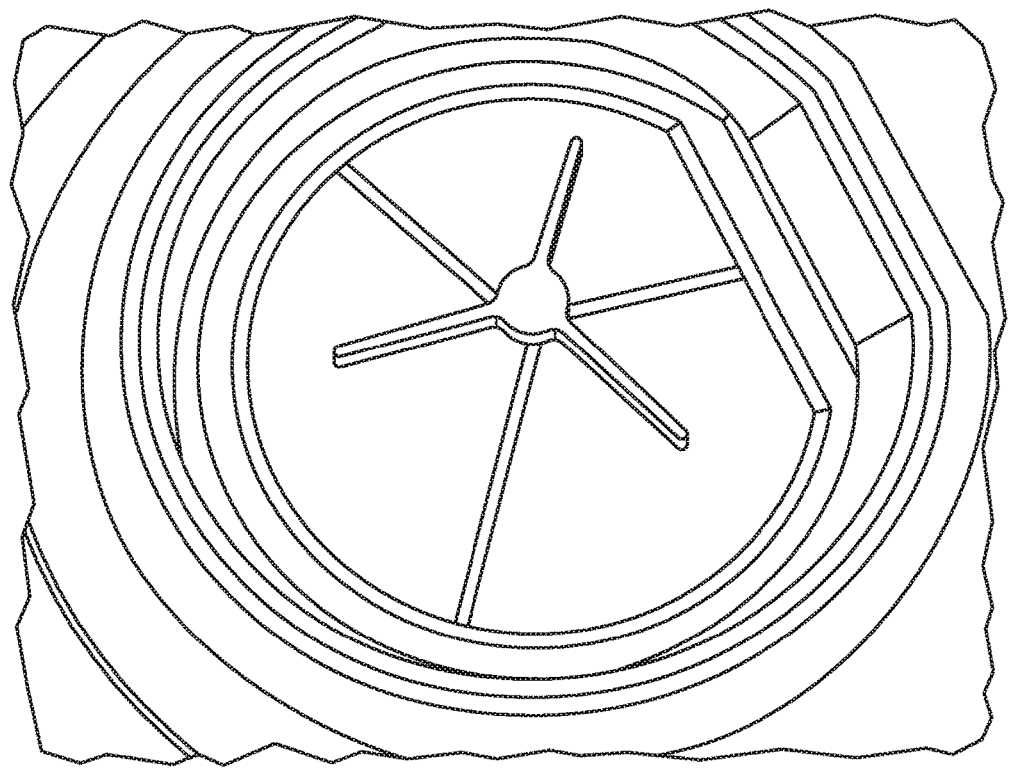
FIG. 24 shows an exemplary picture of a further lifting system according to prior art utilizing a Tripod.

FIG. 24 shows an exemplary picture of a further lifting system 240 according to prior art. The lifting system 240 utilizes a Tripod for a release of a wafer that touches a productive surface of the wafer.

Although embodiments described herein comprise a chuck for holding the wafer at the second main surface, the chuck may also be configured to hold the first main surface, wherein an edge protection device may cover an edge portion of the second main surface and the release device may be configured to mechanically contact the wafer at the first main surface.

Although embodiments described herein comprise a chuck for holding the wafer at the front side, the chuck may also be configured to hold the back side, wherein an edge protection device may cover an edge portion of the front side and the release device may be configured to mechanically contact the wafer at the back side.

Thus, the terms back side and front side as well as first main surface and second main surface may be regarded as substitutes for one another.

Although above described embodiments are described as being configured for releasing a wafer from a chuck, embodiments may also be configured for putting the wafer to the chuck. For example, the wafer may be moved by the release device in a direction opposing of the lifting direction (inverse lifting direction) such that the wafer is moved towards the chuck and may be held by the chuck. Alternatively or in addition, embodiments may be configured for putting the wafer to the chuck at a time instance, e.g., before processing, and for lifting (releasing) the wafer from the chuck at another time instance, e.g., after processing.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A chuck system for handling a wafer including a first and a second main surface, the chuck system comprising:
    a chuck configured to hold the wafer at the second main surface facing the chuck;
    a release device configured to release the wafer from the chuck by mechanically engaging the wafer at an edge portion of the second main surface of the wafer;
    an edge protection device configured to protect an edge portion of the first main surface of the wafer, wherein the edge protection device comprises a housing cavity configured to incorporate the release device; and
    a lift member configured to lift the edge protection device away from the edge portion of the first main surface of the wafer and to lift the release device so as to release the wafer.

2. The chuck system in accordance with claim 1, wherein the lift member is configured to mechanically engage the release device while not engaging the edge protection device in a first state of the chuck system and to engage the release device and the edge protection device in a second state of the chuck system.

3. The chuck system in accordance with claim 1, wherein the lift member is configured to space the edge protection device from the wafer at a first instance of time and actuate the release device such that the wafer is released from the chuck at a second instance of time subsequent to the first instance of time.

4. The chuck system in accordance with claim 1, wherein the lift member is configured to lift the edge protection device from the wafer before lifting the release device so as to release the wafer from the chuck.

5. The chuck system in accordance with claim 1, wherein the edge portion forms an outer ring of the wafer, the outer ring comprising 10% or less of a dimension of the wafer.

6. The chuck system in accordance with claim 1, further comprising an actuator configured to lift the lift member.

7. The chuck system in accordance with claim 1, wherein the lift member comprises a first contact region to mechanically engage the edge protection device and a second contact region to mechanically engage the release device.

8. The chuck system in accordance with claim 1, wherein the chuck is an electrostatic chuck.

9. The chuck system in accordance with claim 1, wherein the release device is configured to mechanically engage the wafer at a number of discrete sections of the edge portion of the second main surface of the wafer.

10. A wafer processing apparatus comprising:
    a chuck system for handling a wafer comprising a first and a second main surface, the chuck system comprising:
    a chuck configured to hold the wafer at the second main surface facing the chuck;
    a release device configured to release the wafer from the chuck by mechanically engaging the wafer at an edge portion of the second main surface of the wafer;
    an edge protection device configured to protect an edge portion of the first main surface of the wafer, wherein the edge protection device comprises a housing cavity configured to incorporate the release device; and
    a lift member configured to lift the edge protection device away from the edge portion of the first main surface of the wafer and to lift the release device so as to release the wafer; and
    a processing chamber surrounding the chuck system, the processing chamber configured to adjust an ambient pressure inside the processing chamber, wherein the ambient pressure is smaller than an atmospheric pressure.

11. A method for handling a wafer including a first and a second main surface, the method comprising:
    holding the wafer with a chuck at the second main surface facing the chuck;
    moving an edge protection device from a first state in which the edge protection device covers an edge portion of the first main surface of the wafer to a second state in which the edge protection device is lifted away from the edge portion of the first main surface; and
    lifting a release device, the release device mechanically engaging the wafer at an edge portion of the second main surface of the wafer releasing the wafer from the chuck,
    wherein moving the edge protection device and lifting the release device comprise lifting a common lift member, and
    wherein the release device is temporarily incorporated by a housing cavity of the edge protection device.

12. The method in accordance with claim 11, wherein the release device is mechanically engaged while the edge protection device is not engaged in a first state and engaging the release device and the edge protection device in a second state.

13. The method in accordance with claim 11, wherein the edge protection device is spaced from the wafer at a first instance of time and the release device is actuated such that the wafer is released from the chuck at a second instance of time subsequent to the first instance of time.

14. The method in accordance with claim 11, wherein the edge protection device is lifted from the wafer before lifting the release device so as to release the wafer from the chuck.

15. The method in accordance with claim 11, wherein the edge portion forms an outer ring of the wafer, the outer ring comprising 10% or less of a dimension of the wafer.

16. The method in accordance with claim 11, wherein the lift member is lifted by an actuator.

17. The method in accordance with claim 11, wherein the lift member mechanically engages the edge protection device at a first contact region, and wherein the lift member mechanically engages the release device at a second contact region.

18. The method in accordance with claim 11, wherein the chuck is an electrostatic chuck.

19. The method in accordance with claim 11, wherein the release device mechanically engages the wafer at a number of discrete sections of the edge portion of the second main surface of the wafer.

* * * * *